United States Patent
Shinriki et al.

(10) Patent No.: US 8,133,555 B2
(45) Date of Patent: Mar. 13, 2012

(54) METHOD FOR FORMING METAL FILM BY ALD USING BETA-DIKETONE METAL COMPLEX

(75) Inventors: Hiroshi Shinriki, Tama (JP); Kunitoshi Namba, Tama (JP); Daekyun Jeong, Tama (JP)

(73) Assignee: ASM Japan K.K. (JP)

( * ) Notice: Subject to any disclaimer, the term of this patent is extended or adjusted under 35 U.S.C. 154(b) by 364 days.

(21) Appl. No.: 12/251,343

(22) Filed: Oct. 14, 2008

(65) Prior Publication Data

US 2010/0092696 A1    Apr. 15, 2010

(51) Int. Cl.
H05H 1/24    (2006.01)
C23C 16/18   (2006.01)

(52) U.S. Cl. .... 427/576; 427/96.8; 427/97.7; 118/723 E

(58) Field of Classification Search ............. 427/255.28, 427/96.8, 97.2, 97.7, 576
See application file for complete search history.

(56) References Cited

U.S. PATENT DOCUMENTS

| | | |
|---|---|---|
| 4,058,430 A | 11/1977 | Suntola et al. |
| 4,210,608 A | 7/1980 | Pinke |
| 4,477,296 A | 10/1984 | Nair |
| 4,604,118 A | 8/1986 | Bocko et al. |
| 4,670,110 A | 6/1987 | Withers et al. |
| 4,860,687 A | 8/1989 | Frijlink |
| 4,891,050 A | 1/1990 | Bowers et al. |
| 4,902,551 A | 2/1990 | Nakaso et al. |
| 4,965,656 A | 10/1990 | Koubuchi et al. |
| 5,106,454 A | 4/1992 | Allardyce et al. |
| 5,382,333 A | 1/1995 | Ando et al. |
| 5,391,517 A | 2/1995 | Gelatos et al. |
| 5,453,494 A | 9/1995 | Kirlin et al. |
| 5,470,661 A | 11/1995 | Bailey et al. |
| 5,637,533 A | 6/1997 | Choi |
| 5,695,810 A | 12/1997 | Dubin et al. |
| 5,711,811 A | 1/1998 | Suntola et al. |
| 5,731,634 A | 3/1998 | Matsuo et al. |
| 5,820,664 A | 10/1998 | Gardiner et al. |
| 5,865,365 A | 2/1999 | Nishikawa et al. |
| 5,884,009 A | 3/1999 | Okase |
| 5,916,365 A | 6/1999 | Sherman et al. |
| 5,923,056 A | 7/1999 | Lee et al. |

(Continued)

FOREIGN PATENT DOCUMENTS

DE    41 08 73    3/1925

(Continued)

OTHER PUBLICATIONS

Li et al; "Atomic Layer Depositio of Ultrathin Copper Metal Films from a Liquid Copper(I) Amidinate Precursor"; Journal of the Electorchemical Society, vol. 153 Issue 11 ( pp. C787-C794); 2006.*

(Continued)

*Primary Examiner* — Dah-Wei Yuan
*Assistant Examiner* — Jose Hernandez-Diaz
(74) *Attorney, Agent, or Firm* — Knobbe, Martens, Olson & Bear LLP

(57) ABSTRACT

A method of forming a single-metal film on a substrate by plasma ALD includes: contacting a surface of a substrate with a β-diketone metal complex in a gas phase; exposing molecule-attached surface to a nitrogen-hydrogen mixed plasma; and repeating the above steps, thereby accumulating atomic layers to form a single-metal film on the substrate.

16 Claims, 11 Drawing Sheets

U.S. PATENT DOCUMENTS

| | | | |
|---|---|---|---|
| 5,939,334 A | 8/1999 | Nguyen et al. |
| 5,989,672 A | 11/1999 | Hayashi |
| 5,998,048 A | 12/1999 | Jin et al. |
| 6,006,763 A | 12/1999 | Mori et al. |
| 6,015,986 A | 1/2000 | Schuegraf |
| 6,033,584 A | 3/2000 | Ngo et al. |
| 6,040,243 A | 3/2000 | Li et al. |
| 6,063,705 A | 5/2000 | Vaartstra |
| 6,066,892 A | 5/2000 | Ding et al. |
| 6,074,945 A | 6/2000 | Vaartstra et al. |
| 6,108,937 A | 8/2000 | Raaijmakers |
| 6,124,189 A | 9/2000 | Watanabe et al. |
| 6,130,123 A | 10/2000 | Liang et al. |
| 6,133,159 A | 10/2000 | Vaartstra et al. |
| 6,136,163 A | 10/2000 | Cheung et al. |
| 6,139,700 A | 10/2000 | Knag et al. |
| 6,143,658 A | 11/2000 | Donnelly et al. |
| 6,144,060 A | 11/2000 | Park et al. |
| 6,171,910 B1 | 1/2001 | Hobbs et al. |
| 6,187,691 B1 | 2/2001 | Fukuda et al. |
| 6,203,613 B1 | 3/2001 | Gates et al. |
| 6,268,291 B1 | 7/2001 | Andricacos et al. |
| 6,217,148 B1 | 8/2001 | Kato et al. |
| 6,270,572 B1 | 8/2001 | Kim et al. |
| 6,281,125 B1 | 8/2001 | Vaartstra et al. |
| 6,294,467 B1 | 9/2001 | Yokoyama et al. |
| 6,297,539 B1 | 10/2001 | Ma et al. |
| 6,303,500 B1 | 10/2001 | Jiang et al. |
| 6,305,314 B1 | 10/2001 | Sneh et al. |
| 6,306,756 B1 | 10/2001 | Hasunuma et al. |
| 6,320,213 B1 | 11/2001 | Kirlin et al. |
| 6,323,131 B1 | 11/2001 | Obeng et al. |
| 6,329,297 B1 | 12/2001 | Balish et al. |
| 6,335,280 B1 | 1/2002 | Van der Jeugd |
| 6,342,277 B1 | 1/2002 | Sherman et al. |
| 6,346,151 B1 | 2/2002 | Jiang et al. |
| 6,347,636 B1 | 2/2002 | Xia et al. |
| 6,352,945 B1 | 3/2002 | Matsuki et al. |
| 6,359,159 B1 | 3/2002 | Welch et al. |
| 6,374,831 B1 | 4/2002 | Chandran et al. |
| 6,380,080 B2 | 4/2002 | Visokay |
| 6,383,955 B1 | 5/2002 | Matsuki et al. |
| 6,387,207 B1 | 5/2002 | Janakiraman et al. |
| 6,391,785 B1 | 5/2002 | Satta et al. |
| 6,395,650 B1 | 5/2002 | Callegari et al. |
| 6,403,414 B2 | 6/2002 | Marsh |
| 6,404,191 B2 | 6/2002 | Daughton et al. |
| 6,420,189 B1 | 7/2002 | Lopatin |
| 6,428,859 B1 * | 8/2002 | Chiang et al. ............... 427/457 |
| 6,428,894 B1 | 8/2002 | Babich et al. |
| 6,433,432 B2 | 8/2002 | Shimizu |
| 6,444,568 B1 | 9/2002 | Sundararajan et al. |
| 6,444,868 B1 | 9/2002 | Vaughn et al. |
| 6,455,424 B1 | 9/2002 | McTeer et al. |
| 6,464,779 B1 | 10/2002 | Powell et al. |
| 6,475,276 B1 | 11/2002 | Elers et al. |
| 6,478,931 B1 | 11/2002 | Wadley et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,527,855 B2 | 3/2003 | De La Rosa et al. |
| 6,534,395 B2 | 3/2003 | Werkhoven et al. |
| 6,541,067 B1 | 4/2003 | Marsh et al. |
| 6,551,399 B1 | 4/2003 | Sneh et al. |
| 6,576,053 B1 | 6/2003 | Kim et al. |
| 6,586,330 B1 | 7/2003 | Ludviksson et al. |
| 6,593,656 B2 | 7/2003 | Ahn et al. |
| 6,617,173 B1 | 9/2003 | Sneh |
| 6,649,091 B2 | 11/2003 | Ryan et al. |
| 6,656,748 B2 | 12/2003 | Hall et al. |
| 6,664,192 B2 | 12/2003 | Satta et al. |
| 6,679,951 B2 | 1/2004 | Soininen et al. |
| 6,680,540 B2 | 1/2004 | Nakano et al. |
| 6,703,708 B2 | 3/2004 | Werkhoven et al. |
| 6,713,381 B2 | 3/2004 | Barr et al. |
| 6,720,262 B2 | 4/2004 | Koh et al. |
| 6,759,325 B2 | 7/2004 | Raaijmakers et al. |
| 6,777,331 B2 | 8/2004 | Nguyen |
| 6,784,101 B1 | 8/2004 | Yu et al. |
| 6,784,504 B2 | 8/2004 | Derderian et al. |
| 6,800,542 B2 | 10/2004 | Kim |
| 6,800,567 B2 | 10/2004 | Cho et al. |
| 6,824,816 B2 | 11/2004 | Aaltonen et al. |
| 6,842,740 B1 | 1/2005 | Jeran et al. |
| 6,849,122 B1 | 2/2005 | Fair |
| 6,852,635 B2 | 2/2005 | Satta et al. |
| 6,878,628 B2 | 4/2005 | Sophie et al. |
| 6,881,260 B2 | 4/2005 | Marsh et al. |
| 6,881,437 B2 | 4/2005 | Ivanov et al. |
| 6,887,795 B2 | 5/2005 | Soininen et al. |
| 6,921,712 B2 | 7/2005 | Soininen et al. |
| 6,933,225 B2 | 8/2005 | Werkhoven et al. |
| 6,936,535 B2 | 8/2005 | Kim et al. |
| 6,955,986 B2 | 10/2005 | Li |
| 6,984,591 B1 | 1/2006 | Buchanan et al. |
| 7,011,981 B2 | 3/2006 | Kim et al. |
| 7,067,407 B2 | 6/2006 | Kostamo et al. |
| 7,105,054 B2 | 9/2006 | Lindfors |
| 7,107,998 B2 | 9/2006 | Greet et al. |
| 7,118,779 B2 | 10/2006 | Verghese et al. |
| 7,135,207 B2 | 11/2006 | Min et al. |
| 7,183,604 B2 | 2/2007 | Cartier |
| 7,220,451 B2 | 5/2007 | Aaltonen et al. |
| 7,220,669 B2 | 5/2007 | Hujanen et al. |
| 7,241,677 B2 | 7/2007 | Soininen et al. |
| 7,256,144 B2 | 8/2007 | Koyanagi et al. |
| 7,273,526 B2 | 9/2007 | Shinriki et al. |
| 7,273,814 B2 | 9/2007 | Matsuda |
| 7,300,873 B2 | 11/2007 | Millward |
| 7,404,985 B2 | 7/2008 | Chang et al. |
| 7,419,903 B2 | 9/2008 | Haukka et al. |
| 7,435,484 B2 | 10/2008 | Shinriki et al. |
| 7,438,949 B2 | 10/2008 | Weidman |
| 7,476,618 B2 | 1/2009 | Kilpela et al. |
| 7,494,927 B2 | 2/2009 | Kostamo et al. |
| 7,541,284 B2 | 6/2009 | Park |
| 7,566,661 B2 * | 7/2009 | Lavoie ...................... 438/681 |
| 7,601,223 B2 | 10/2009 | Lindfors et al. |
| 7,615,480 B2 | 11/2009 | Boyd |
| 7,655,564 B2 | 2/2010 | Shinriki |
| 7,666,773 B2 | 2/2010 | Huotari et al. |
| 2001/0003064 A1 | 6/2001 | Ohto |
| 2001/0013617 A1 | 8/2001 | Toyoda et al. |
| 2001/0018266 A1 | 8/2001 | Jiang et al. |
| 2001/0030366 A1 | 10/2001 | Nakano et al. |
| 2001/0041250 A1 | 11/2001 | Werkhoven et al. |
| 2001/0052318 A1 | 12/2001 | Jiang et al. |
| 2002/0004293 A1 | 1/2002 | Soininen et al. |
| 2002/0006711 A1 | 1/2002 | Yamazaki et al. |
| 2002/0011210 A1 | 1/2002 | Satoh et al. |
| 2002/0013487 A1 | 1/2002 | Norman et al. |
| 2002/0027286 A1 | 3/2002 | Sundararajan et al. |
| 2002/0173054 A1 | 11/2002 | Kim |
| 2003/0013302 A1 | 1/2003 | Nguyen et al. |
| 2003/0059535 A1 | 3/2003 | Luo et al. |
| 2003/0080363 A1 | 5/2003 | Maruyama et al. |
| 2003/0091938 A1 | 5/2003 | Fairbairn et al. |
| 2003/0100162 A1 | 5/2003 | Joo |
| 2003/0121608 A1 | 7/2003 | Chen et al. |
| 2003/0135061 A1 | 7/2003 | Norman et al. |
| 2003/0165615 A1 | 9/2003 | Aaltonen et al. |
| 2003/0214043 A1 | 11/2003 | Saitoh et al. |
| 2003/0219991 A1 | 11/2003 | Geusic et al. |
| 2003/0233976 A1 | 12/2003 | Marsh et al. |
| 2004/0005753 A1 | 1/2004 | Kostamo et al. |
| 2004/0028952 A1 | 2/2004 | Cartier et al. |
| 2004/0038529 A1 | 2/2004 | Soininen et al. |
| 2004/0041194 A1 | 3/2004 | Marsh |
| 2004/0053496 A1 | 3/2004 | Choi |
| 2004/0082125 A1 | 4/2004 | Hou et al. |
| 2004/0087143 A1 | 5/2004 | Norman et al. |
| 2004/0105934 A1 | 6/2004 | Chang et al. |
| 2004/0118697 A1 | 6/2004 | Wen et al. |
| 2004/0126944 A1 | 7/2004 | Rotondaro et al. |
| 2004/0142558 A1 | 7/2004 | Granneman |
| 2004/0152255 A1 | 8/2004 | Seidl et al. |
| 2004/0192021 A1 | 9/2004 | Li |

| | | | |
|---|---|---|---|
| 2004/0192036 A1 | 9/2004 | Koyanagi et al. |
| 2004/0214354 A1 | 10/2004 | Marsh et al. |
| 2004/0216668 A1 | 11/2004 | Lindfors et al. |
| 2004/0224475 A1 | 11/2004 | Lee et al. |
| 2005/0009325 A1 | 1/2005 | Chung et al. |
| 2005/0020060 A1 | 1/2005 | Aaltonen et al. |
| 2005/0048794 A1 | 3/2005 | Brask et al. |
| 2005/0082587 A1 | 4/2005 | Marsh |
| 2005/0085031 A1 | 4/2005 | Lopatin et al. |
| 2005/0087879 A1 | 4/2005 | Won et al. |
| 2005/0089632 A1 | 4/2005 | Vehkamaki et al. |
| 2005/0092247 A1 | 5/2005 | Schmidt et al. |
| 2005/0098440 A1 | 5/2005 | Kailasan et al. |
| 2005/0112509 A1 | 5/2005 | Fairbairn et al. |
| 2005/0118807 A1 | 6/2005 | Kim et al. |
| 2005/0124154 A1 | 6/2005 | Park et al. |
| 2005/0181555 A1 | 8/2005 | Haukka et al. |
| 2005/0208754 A1 | 9/2005 | Kostamo et al. |
| 2005/0229848 A1 | 10/2005 | Shinriki et al. |
| 2005/0238808 A1 | 10/2005 | Gatineau et al. |
| 2005/0266700 A1 | 12/2005 | Jursich et al. |
| 2005/0271812 A1 | 12/2005 | Myo et al. |
| 2006/0013955 A1 | 1/2006 | Senzaki |
| 2006/0035462 A1 | 2/2006 | Millward |
| 2006/0073276 A1 | 4/2006 | Antonissen |
| 2006/0084280 A1 | 4/2006 | Matsuki et al. |
| 2006/0093848 A1 | 5/2006 | Senkevich et al. |
| 2006/0118968 A1 | 6/2006 | Johnston et al. |
| 2006/0121733 A1 | 6/2006 | Kilpela et al. |
| 2006/0128150 A1 | 6/2006 | Gandikota et al. |
| 2006/0137608 A1 | 6/2006 | Choi et al. |
| 2006/0165892 A1 | 7/2006 | Weidman |
| 2006/0177601 A1 | 8/2006 | Park et al. |
| 2006/0211228 A1 | 9/2006 | Matsuda |
| 2006/0216932 A1 | 9/2006 | Kumar et al. |
| 2006/0223300 A1 | 10/2006 | Simka et al. |
| 2006/0263977 A1 | 11/2006 | Kim et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0059502 A1 | 3/2007 | Wang et al. |
| 2007/0082132 A1 | 4/2007 | Shinriki et al. |
| 2007/0128864 A1* | 6/2007 | Ma et al. | 438/680 |
| 2007/0190782 A1 | 8/2007 | Park et al. |
| 2007/0218705 A1 | 9/2007 | Matsuki et al. |
| 2007/0248767 A1 | 10/2007 | Okura et al. |
| 2007/0254488 A1 | 11/2007 | Huotari et al. |
| 2008/0038465 A1 | 2/2008 | Dussurrat |
| 2008/0054472 A1 | 3/2008 | Shinriki et al. |
| 2008/0102613 A1* | 5/2008 | Elers | 438/680 |
| 2008/0124484 A1 | 5/2008 | Shinriki et al. |
| 2008/0146042 A1 | 6/2008 | Kostamo et al. |
| 2008/0171436 A1 | 7/2008 | Koh et al. |
| 2008/0200019 A9 | 8/2008 | Huotari et al. |
| 2008/0206982 A1 | 8/2008 | Suzuki |
| 2008/0206985 A1 | 8/2008 | Kim et al. |
| 2008/0214003 A1 | 9/2008 | Xia |
| 2008/0296768 A1 | 12/2008 | Chebiam |
| 2008/0315418 A1 | 12/2008 | Boyd |
| 2008/0318417 A1 | 12/2008 | Shinriki et al. |
| 2009/0068832 A1 | 3/2009 | Haukka et al. |
| 2009/0087339 A1 | 4/2009 | Shinriki |
| 2009/0104777 A1 | 4/2009 | Kim |
| 2009/0155997 A1 | 6/2009 | Shinriki |
| 2009/0163024 A1 | 6/2009 | Kim et al. |
| 2009/0209101 A1 | 8/2009 | Shinriki et al. |
| 2010/0055433 A1 | 3/2010 | Shinriki et al. |

FOREIGN PATENT DOCUMENTS

| | | |
|---|---|---|
| EP | 0 469 456 | 7/1991 |
| EP | 0 469 470 | 2/1992 |
| EP | 0 880 168 A2 | 11/1998 |
| EP | 1 688 923 A2 | 8/2006 |
| GB | 368850 | 12/1930 |
| GB | 1518243 | 7/1978 |
| GB | 2340508 A | 2/2000 |
| JP | 1998-340994 | 12/1998 |
| JP | 2003-168738 A | 6/2003 |
| KR | 10-2001-004717 | 1/2001 |
| KR | 10-2001-004718 | 1/2001 |
| KR | 10-2001-004719 | 1/2001 |
| KR | 10-2001-96408 | 11/2001 |
| KR | 10-2001-112889 | 12/2001 |
| KR | 10-2003-0011399 | 2/2003 |
| KR | 1020050103373 | 10/2005 |
| WO | WO 93/10652 | 5/1993 |
| WO | WO 98/01890 | 1/1998 |
| WO | WO 99/17343 | 4/1999 |
| WO | WO 00/03420 | 1/2000 |
| WO | WO 00/38191 | 6/2000 |
| WO | WO 01/88972 | 5/2001 |
| WO | WO 01/50502 | 7/2001 |
| WO | WO 02/09126 | 7/2001 |
| WO | WO 02/09158 | 7/2001 |
| WO | WO 03/023835 | 3/2003 |
| WO | WO 03/040150 | 5/2003 |
| WO | WO 03/056612 A1 | 7/2003 |
| WO | WO 2004/035858 | 4/2004 |
| WO | WO 2006/035281 | 4/2006 |

OTHER PUBLICATIONS

Arnal, V. et al., Materials and processes for high signal propagation performance and reliable 32 nm node BEOL., 2007 International Interconnect Technology Conference, 2007 IEEE, pp. 1-3, ISBN 1-4244-1069-X/07.

Namba, K. et al., "PEALD of Ru layer on WNC ALD barrier for Cu/porous low-k integration," Proceedings of Advanced Metallization Conference 2006, p. 39.

Jeong, Seong-Jun et al., "Plasma enhanced atomic layer deposition of Ru-TaN thin films for the application of Cu diffusion barrier," ALD Conference 2006, pp. 1-23.

Morisada et al., "Method of self-cleaning of carbon-based film," U.S. Appl. No. 11/868,437, filed Oct. 5, 2007.

Shao, I. et al., "An alternative low resistance MOL technology with electroplated rhodium as contact plugs for 32nm CMOS and beyond," 2007 International Interconnect Technology Conference, 2007 IEEE, pp. 102-104, ISBN 1-4244-1070-3/07.

Shinriki et al., "Atomic composition controlled ruthenium alloy film formed by plasma-enhanced atomic layer deposition," U.S. Appl. No. 12/201,434, filed Aug. 29, 2008.

Shinriki et al., "Method for activating reactive oxygen species for cleaning carbon-based film deposition," U.S. Appl. No. 12/058,629, filed Mar. 28, 2008.

Shinriki, "Method for forming ruthenium complex film using B-diketone coordinated ruthenium precursor," U.S. Appl. No. 12/203,405, filed on Sep. 3, 2008.

Shinriki, H. et al., "Ruthenium alloy film for copper interconnects," U.S. Appl. No. 12/129,345, filed May 29, 2008.

Yang, C.C. et al., "Physical, electrical, and reliability characterization of Ru for Cu interconnects," 2006 International Interconnect Technology Conference, 2006 IEEE, pp. 187-190, ISBN 1-4244-0103-8/06.

Jung et al., "A Novel Ir/IrO2/Pt-PZT-Pt/IrO2/Ir Capacitor for a Highly Reliable Mega-Scale FRAM," IEEE, IED 2000, Session 34 (2000).

Kadota, Takumi et al., "Ruthenium Films Deposited under H2 by MOCVD using a Novel Liquid Precursor". IEEE article, pp. 175-176, no date available.

Kawaguchi, "MPEG1 Decoder LSI for video CD μPD61012," NEC Device Technology International. New Products 5 No. 48, pp. 4-8 (Jan. 1998).

Kawamoto et al., "The Outlook for Semiconductor Processes and Manufacturing Technologies in the 0.1-μm Age," Hitachi Review 48(6): 334-339 (1999).

Koh et al., U.S. Appl. No. 11/972,081, filed Jan. 10, 2008.

Kwon et al., "Plasma-enhanced Atomic Layer Deposition of Ruthenium Thin Films," Electrochemical and Solid-State Letters, 7(4), C46-C48 (2004).

Kwon et al., "Plasma-enhanced Atomic Layer Deposition of RuTiN Thin Films for the Application of Copper Diffusion Barrier," ALD Conference, 2004.

Kwon et al., "Ruthenium Bottom Electrode Prepared for Electroplating for a High Density DRAM Capacitor ," J. Electrochem. Soc. 151(2): C127-C132 (2004.).

Lee et al., "Electroless CoWP boosts copper reliability, device performance," Semiconductor International , Jul. 1, 2004, 5 pages.

NEC Device Technology International, "Current state of leading edge ULSI process technology and future trends," No. 48, pp. 4-8 (1998).

Nilsen et al., "Thin Film Deposition of Lanthanum Manganite Perovskite by the ALE process," Journal of Materials Chemistry, vol. 9, 1781-1784 (1999).

Onda et al., "DC-Hydrogen Plasma Cleaning a Novel Process for IC-Packaging", SEMICON WEST 97, Packaging Materials Conference, 1997, pp. D-1-D-10.

Onda et al., "Hydrogen plasma cleaning a novel process for IC-packaging," SEMICON WEST 97, Packaging Materials Conference, 1997, pp. D-1-D-10.

Pakrad, "Pure Tech: Growth of MR/GMR Head Materials," World Wide Web, Puretechinc.com/tech_papers/tech_papers-4.htm, pp. 1-2 (1999.).

Paranjpe et al., "Atomic Layer Deposition of AlOx for thin Film Head Gap Applications," Journal of Electrochemical Society, V 148(9), G 465-G471, Jul. 16, 2001.

Park et al., "Metallorganic Chemical Vapor Deposition of Ru and RuO2 using Ruthenocene Precursor and Oxygen Gas," J.Electrochem. Soc., 147[1], 203, 2000.

Parsons et al., "Microcontact Patterning of Ruthenium Gate Electrodes by Selective Area,"North Carolina State University, presentation at AVS conference on Atomic Layer Deposition (ALD 2004), Helsinki Finland, Aug. 16, 2004.

Ritala et al., "Atomic Layer Deposition," Handbook of Thin Film Materials vol. 1: Deposition and Processing of Thin Films, chapter 2, pp. 103-159 (2002).

Rossnagel, "The latest on Ru-Cu interconnect technology," Solid State Technology, Feb. 2005, Online, pp. 1-4.

U.S. Appl. No. 10/728,126, filed Dec. 3, 2003, Granneman.
U.S. Appl. No. 10/782,727, filed Feb. 18, 2004, Lindfors et al.
U.S. Appl. No. 11/254,071, filed Jun. 8, 2006, Kilpela.
U.S. Appl. No. 11/367,177, filed Mar. 3, 2006, Shinriki et al.
U.S. Appl. No. 11/469,828, filed Sep. 1, 2009, Shinriki et al.
U.S. Appl. No. 11/557,891, filed Nov. 8, 2006, Shinriki et al.
U.S. Appl. No. 11/955,275, filed Dec. 12, 2007, Shinriki.
U.S. Appl. No. 11/972,081, filed Jan. 10, 2008, Koh.
U.S. Appl. No. 12/337,141, filed Dec. 17, 2008, Kim et al.
U.S. Appl. No. 60/976,378, filed Sep. 28, 2007, Shinriki.
U.S. Appl. No. 61/178,871, May 15, 2009, Hamalainen et al.

Aaltonen et al., "Ruthenium Thin Film Grown by Atomic Layer Deposition," Chem. Vap. Deposition, 9[1], 45, 2003.

Aaltonen et al., "ALD of Rhodium Thin Films from RH (acac)3 and Oxygen," Electrochem. Solid-State Lett. 8 (8): C99-C101 (2005).

Aaltonen et al., "Atomic Layer Deposition of Iridium Thin Films," J. Electrochem. Soc. 151(8): G489-G492 (2004).

Aaltonen et al., "Atomic Layer Deposition of Noble Metal Thin Films," dissertation presented at University of Helsinki, Helsinki, Finland, 2005.

Aaltonen et al., "Atomic Layer Deposition of Noble Metals: Exploration of the Low Limit of the Deposition Temperature," J. Mat. Res. Soc. 19(11): 3353-3358 (2004).

Aaltonen et al., "Atomic Layer Deposition of Platinum Thin Films," Chem. Mater. 15:1924-1928 (2003).

Aaltonen et al., "Atomic Layer Deposition of Ruthenium Thin Films from Ru(thd)$_3$ and Oxygen," Chem. Vap. Deposition, 2004, vol. 10, Issue 4, pp. 215-219.

Aaltonen et al., "Reaction Mechanism Studies on Atomic Layer Deposition of Ruthenium and Platinum," Electrochem. Solid-State Lett., (2003), vol. 6, pp. C130-C133.

Addison et al., "The Vapour Pressure of Anhydrous Copper Nitrate and its Molecular Weight in the Vapour State," J.Chem. Soc., pp. 3099-3106 (1958).

Akerman et al., "Identifying Tunneling in Ferromagnetic-Insulator-Ferromagnetic Thin Film Structures," World Wide Web, physics. ucsd.eduiksgrp/Tunneling.html, Sep. 10, 2008, pp. 1-6.

Aoyama et al., "Chemical Vapor Deposition of Ru and Its Application in (Ba, Sr) TiO3 Capacitors for Future Dynamic Random Access Memories," Jpn. J. Appl. Phys. 38(43): 2194-2199 (1999).

Aoyama, et al., "Ruthenium Films Prepared by Liquid Source Chemical Vapor Deposition Using Bis-(ethylcyclopentadienyl)ruthenium". Jpn. J. Appl. Phys., vol. 38 (1999) pp. L1134-L1136.

Baklanov et al., "Characterization of Cu surface cleaning by hydrogen plasma," Journal Vac. Sci. Technol. 19(4): 1201-1211 (2001).

Baliga, J., Associate Editor, "New designs and materials tackle 1 Gb memory challenges," Semiconductor International, World Wide Web address: semiconductor.net, Nov. 2000.

Basceri, C. "Electrical and Dielectric Properties of (BA, SR) TiO3 Thin Film Capacitors for Ultra-High Density Dynamic Random Access Memories," Ph.D. thesis, 1997, pp. 13-31, Raleigh, N.C. State University.

Bobo et al., Spin Dependent Tunneling Junctions with Hard Magnetic Layer Pinning, Journal of Applied Physics, 1998, vol. 83, No. 11, pp. 6685-6687.

Bursky, "Hit Up IEDM for Gigabit and Denser DRAMs and Merged Logic/Memory," Electronic Design, World Wide Web address: planetee.com, Dec. 1, 1998.

Campbell et al., "Titanium dioxide (TiO2)-based gate insulators,"IBM J. Res. Develop., May 1999, pp. 383-392, vol. 43, No. 3.

Daughton, "Advanced MRAM Concepts," World Wide Web nve.com/otherbiz/mram2.pdf, Feb. 7, 2001, pp. 1-6.

Dussarrat et al., "Precursor for film formation and method for forming ruthenium-containing film," Apr. 2006, WO 2006/035281 A1.

Fereday et al., "Anhydrous Cobalt (III) Nitrate," Chemical Communications, p. 271 (1968).

Fukuzumi et al., "Liner-Supported Cylinder (LSC) Technology to Realize RU/Ta2O5/Ru Capacitor for Future DRAMs," IEEE, IED 2000, Session 34 (2000).

Fullerton et al., "Advanced Magnetic Recording Media for High-Density Data," Solid State Technology 44(i9): 87 (2001).

Giant Magnetoresistance, World Wide Web, stoner.leeds.ac.uk/research/gmr.htm, pp. 1-6, (2004).

Giant Magnetoresistive (GMR) Heads, The PC Guide, World Wide Web, pc.guide.com/ref/hdd/op/heads/techGMR-c.html, accessed Jul. 3, 2009, pp. 1-4.

GMR Head Technology: Increased Areal Density and Improved Areal Density, World Wide Web, magahaus.com/tech/westerndigital/shitepapers/gmr_wp.shtml, pp. 1-4 (Feb. 2000).

GMR Read-Write Heads Yield Data Storage Record, Semiconductor International, semiconductor.net/semiconductor/issues/Issues/1998/feb98/docs/emerging.asp, p. 1 (Feb. 1998).

Hones et al., "MOCVD of Thin Ruthenium Oxide Films: Properties and Growth Kinetics," Chem. Vap. Deposition 6(4): 193-198 (2000).

Hoyas et al., Growth and characterization of atomic layer deposited WC0.7N0.3 on polymer films, Journal of Applied Physics, Jan. 1, 2004, vol. 95, Issue 1, pp. 381-388.

Hu et al., "In situ rapid thermal oxidation and reduction of copper thin films and their applications in ultralarge scale integration," Journal of The Electrochemical Society 148(12): G669-G675 (2001).

Hur'Yeva, Tetyana, et al., "Ruthenium Films Deposited by Liquid-Delivery MOCVD using Bis(ethylcyclopentadienyl)ruthenium with Toulene as the Solvent". Chemical Vapor Deposition 2006, 12, pp. 429-434.

Imai, "100 Gbit/Inch HDD Just Around the Corner," Nikkei Electronics Asia, nikkeibp.asiabiztech.com/nea/200008/108675.html, p. 1-5 (Aug. 2000).

Inoue et al., "Low thermal-budget fabrication of sputtered-PZT capacitor on multilevel interconnects for embedded FeRAM," IEEE, IED 2000, 2000, Session 34.

Integrated Circuit Engineering Corporation, Practical Integrated Circuit Fabrication Seminar (1998).

Paranjpe et al., "Atomic Layer Deposition of AlOx for thin Film Head Gap Applications," Journal of Electrochemical Society, V 148(9), G 465-G471, Jul. 17, 2001.

Sakurai et al., "Adsorption of ruthenium tetroxide on metal surfaces," J. Phys., Chem. American Chemical Society, 1985, vol. 89, pp. 1892-1896.

Satta et al., "The Removal of Copper Oxides by Ethyl Alcohol Monitored in Situ by Spectroscopic Ellipsometry," Journal of the Electrochemical Society, 2003, 150 (5), pp. 300-306.

Singer, "Progress in Copper: A Look Ahead," Semiconductor International, May 1, 2002.

SOI Technology: IBM's Next Advance in Chip Design, 1998.

Solanki et al., "Atomic Layer Deposition of Copper Seed Layers," Electrochemical and Solid-State Letters 3(10): 479-480 (2000).

Sundani et al., "Oral Presentation of Dual Damascene Process," slides, Nov. 19, 1998.

Suntola, "Atomic Layer Epitaxy," Handbook of Crystal Growth, vol. 3, chapter 14, pp. 601-663 (1994).

Tung et al., Atomic Layer Deposition of Noble Metals: Exploration of the low limit of the deposition temperature, J. Mater. Res., vol. 19, No. 11, p. 3353-3357 (Nov. 2004).

Ueno et al., "Cleaning of the CHF3 plasma-etched SiO2/SiN/Cu via Structures Using a Hydrogen Plasma, an Oxygen Plasma and Hexafluoracetylacetone vapors," J. Vac. Sci. Technology B. vol. 16, No. 6, pp. 2986-2995 (1998).

Utrianen et al., "Studies of metallic thin film growth in an atomic layer epitaxy reactor using M(acac)2 (M=Ni, Cu, Pt) precursors," Applied Surface Science 157: 151-158 (2000).

Utrianen et al., "Studies of NiO thin film formation by atomic layer epitaxy," Materials Science and Engineering B54: 98-103 (1998).

Wang, "Advanced Materials for Extremely High Density Magnetic Recording Heads," Center for Research on Information Storage Materials, Stanford University, presentation. 20 pages, (1999).

Winbond News Release, "Successful development of capacitor technology for next generation memory," winbond.com, Dec. 13, 2000.

Won et al., "Conformal CVD-ruthenium process for MIM capacitor in giga-bit DRAMs," IEEE, IED 2000, Session 34 (2000).

Xu et al. "A breakthrough in low-k barrier/etch stop films for copper damascene applications," Semiconductor Fabtech, 2000, pp. 239-244, 11th Edtion.

Yagishita et al., "Cleaning of Copper Surface Using Vapor-Phase Organic Acids," MRS Proceedings, vol. 766, MRS Spring 2003 Meeting, Apr. 21-25, 2003, Symposium E, Session E3, Paper E3.28.

Yoon et al., "Development of an RTA process for the enhanced crystallization of amorphous silicon thin film," Electrochemical Society Proceedings 2000-9: 337-343 (2000).

Yoon et al., "Investigation of RuO2-incorporated Pt layer as a Bottom Electrode and Diffusion Barrier for High Epsilon Capacitor Applications," Electrochemical and Solid-State Letters 3(8): 373-376 (2000).

Yoon et al., "Tantalum-ruthenium dioxide as a diffusion barrier between Pt bottom electrode and TiSi2 ohmic contact layer for high density capacitors," Journal of Applied Physics 86(5): 2544-2549 (1999).

* cited by examiner

METHOD FOR FORMING METAL FILM BY ALD USING BETA-DIKETONE METAL COMPLEX

BACKGROUND OF THE INVENTION

1. Field of the Invention

The present invention, generally, relates to a method for forming metal wirings that can be used favorably in the creation of fine semiconductor elements. More specifically, the present invention relates to a method for forming a metal film by atomic layer deposition using a β-diketone metal complex.

2. Description of the Related Art

Next-generation fine semiconductor elements require formation of semiconductor elements having not only two-dimensional structures, but also three-dimensional structures. Accordingly, the formation of metal wirings for such fine semiconductor elements also requires the ratio of wiring height to wiring width to be improved to a range of 5 to 10, and the ratio of height to hole diameter to a range of approx. 5 to 10 for connection holes used to connect top-layer wirings and bottom-layer wirings. For this reason, it becomes necessary, when forming copper wirings for use as these metal wirings, to form a thin metal film that not only provides a copper diffusion barrier to prevent diffusion of copper, but also achieves good shielding property.

To this end, wiring structures having such high aspect ratios are creating a need to form metal films using the CVD method and ALD method known to achieve good shielding property, instead of forming metal films using the conventional PVD method. In particular, metal films that serve as Cu diffusion barriers must be thin, low in resistivity in order to prevent an increase of the wiring resistance, and formed in a manner ensuring good shielding property in areas of high aspect ratios, and these requirements necessitate use of the CVD method and ALD method to form these metal films. Among others, metal films that serve as Cu diffusion barriers for Cu wirings have traditionally used Ta/TaN films produced by PVD. With the PVD method, however, it is difficult to form barrier films having a uniform thickness over wirings of high aspect ratios or via holes and contact holes used for connecting wirings, and instead the PVD method tends to produce discontinuous films on side faces of trenches, via holes and contact holes, especially on side faces at the bottom of height gaps, as the film thickness decreases. As a result, Cu films formed by the PVD method on top of these barrier films also tend to become discontinuous. For this reason, voids are generated in electroplated copper layers where these discontinuous Cu films are used as seeds, which makes it difficult to form good wirings.

As a countermeasure, a method is currently reported in the area of Cu film forming using the PVD method, where a CVD-Co film is formed on top of a PVD-TaN film, instead of forming a PVD-Ta/TaN film under the traditional method, after which a Cu film is formed to form a continuous Cu film (U.S. Pat. No. 6,365,502). Since a smoother PVD-Cu film can be easily formed on a CVD-Ru film compared to on a PVD-Ta/TaN film, good burying property can be achieved at the time of Cu plating. Even when a film produced by the PVD-Cu process is used as a seed layer, therefore, good Cu plating can be achieved by forming a Co film or Ru film as the foundation. Among the film deposition methods using organic metal materials, the chemical vapor deposition (CVD) method produces films having higher resistivity than bulk films because of the effects of hydrocarbons, etc., breaking away from organic ligands and remaining in the film. In the case of the CVD method, high impurities and consequent low surface smoothness make it generally difficult to form a continuous film when the film thickness is reduced. Furthermore, it is difficult to achieve good adhesion when a Cu film is formed on top of the aforementioned film lacking in continuity. Although the CVD method normally achieves good shielding property under general conditions, when finer elements are needed and thus the aspect ratios of wiring trenches and connection holes must be increased substantially, it is difficult to shield the wirings effectively. Accordingly, the atomic layer deposition (ALD) method is desirable in situations where the film thickness must be reduced but the required shielding property must also be achieved. Under the ALD method, material molecules are adsorbed onto the surface in a uniform manner, after which the adsorbed molecules are caused to react with a different gas to break down and thereby eliminate the ligands, in order to form a desired metal film. With this method, however, finding a proper combination of a type of molecule that can be adsorbed to achieve good shielding property on one hand, and a type of reactant gas capable of easily breaking down the ligands of such molecule on the other, is difficult, and normally the resulting film tends to contain impurities such as residual carbon, oxygen and nitrogen and its resistivity is also likely much higher than the intended level. Under U.S. Pat. No. 6,527,855, a method to form a Co film using an organic metal material of Co and hydrogen gas is described, wherein oxygen gas is supplied after hydrogen gas is supplied. Under this method, however, the formed Co film tends to contain residual carbon and oxygen from the organic metal material and it is therefore difficult to obtain a quality Co film offering low resistivity.

Also, a Cu film required in electroplating as a seed layer must be formed thinly and continuously, just like a Co film. Particularly when a finer element is needed and thus an attempt is made to form a Cu film by the conventional PVD method inside a via hole of 20 to 30 nm in size, only a discontinuous Cu film is formed inside the via hole. If conditions are changed to form a continuous Cu film, on the other hand, the opening of the via hole is buried by the Cu film and voids generate inside the hole. These situations also present the need to form a thin, continuous Cu film.

SUMMARY

An embodiment of the present invention provides a method for forming a film at low temperature and in a reducing atmosphere from a material that constitutes a metal element where β-diketone can be coordinated, such as any one of 8B, 1B and 2B family elements, or specifically Fe, Ni, Rh, Pd, Ir, Pt, Co, Ru and Cu in practical settings, wherein the resulting metal film exhibits low resistivity and high shielding property. The basic principles of the present invention are achieved by two processes. When any of the aforementioned metal complexes coordinated by β-diketone (hereinafter referred to as "β-diketone metal complexes") is supplied to a substrate, such β-diketone metal complex has the property of easily adsorbing onto the substrate. Accordingly, the first principle of the present invention is that the β-diketone metal complex can be easily adsorbed onto the substrate surface in a uniform manner regardless of whether a metal film or oxide film is formed. The second principle is that by exposing the metal complex coordinated by β-diketone to a mixture gas of hydrogen and nitrogen that has been activated by plasma, β-diketone groups can be eliminated from the metal element in an extremely quick and reliable manner. By allowing the metal atoms to remain on the substrate surface this way, a metal film can be formed with ease. This quick and reliable elimination of β-diketone groups from the metal element dramatically increases the atomic layer deposition rate and also dramatically improves the purity of the metal element in the formed atomic layer.

There have been no reports to date regarding the exposure of a β-diketone metal complex to hydrogen/nitrogen plasma as mentioned above, and it has not been known to date that β-diketone ligands could be eliminated very easily this way. For example, U.S. Pat. No. 6,527,855 B2 describes a process for forming a metal film from an organic metal material containing β-diketone, wherein an organic metal material containing β-diketone ligands is supplied to a substrate to be adsorbed onto the substrate surface, which is followed by a hydrogen gas supply cycle and steps to purge the supplied hydrogen and then supply oxygen gas. This is because the step to supply oxygen gas breaks down the organic metal material containing β-diketone ligands. Based on an experiment conducted by the present inventors, only high-resistivity Co films could be achieved when hydrogen gas alone was supplied. When oxygen gas was supplied, the problem of oxidization of the TaN film at the foundation occurred. Accordingly, after the supply of hydrogen gas the present inventors applied high-frequency power to the hydrogen gas to excite the gas and then implemented the film forming process using the excited hydrogen. This lowered the resistivity levels, but they were still at least 20 times higher than the resistivity levels of bulk films. Next, the present inventors introduced a mixture gas of hydrogen and nitrogen by adjusting the nitrogen mixing ratio to a range of approx. 0.01 to 0.5 of the total gas flow rate, and then applied high-frequency power to this gas and implemented the film forming process using the excited mixture gas of hydrogen and nitrogen, and ultimately found that the resistivity levels were kept in a range of 1 to 5 times the resistivity levels of bulk films. It should be noted that the resistivity levels fluctuated somewhat depending on the plasma power output and plasma application time, where raising the power output and increasing the application time reduced the resistivity. Under practical conditions of high-frequency power and plasma application time, however, resistivity levels of not more than 5 times, or more desirably not more than twice, the resistivity levels of bulk films could be achieved. These results suggest that this production method can be used favorably in the formation of metal films using organic metal materials.

Accordingly, in an embodiment of the present invention metal films such as Co film, Ru film and Cu film having lower resistivity than those achievable under conventional methods can be formed by repeating the step to supply an organic metal material containing β-diketone ligands, step to purge the organic metal material, step to supply a mixture gas of hydrogen and nitrogen and then implementing the film forming process using the mixture gas excited through application of high-frequency power, and step to purge the mixture gas. This method also causes organic metal materials of Co, Ru and Cu containing β-diketone ligands to be adsorbed easily onto an oxide film or metal film, and therefore very good shielding property can be achieved even with wirings having high aspect ratios such as those used in fine semiconductor wirings. For a trench with an aspect ratio is 7, for example, shielding property of 90% or more can be achieved with ease. Likely reasons that explain this lower resistance include the presence of activated excited species such as —NH and —NH$_2$ generated by the excitation of a mixture gas of hydrogen and nitrogen, because these excited species sever the bond between β-diketone and metal and themselves bond with β-diketone, with the β-diketone-bonded excited species eventually gasifying and being discharged. These phenomena have never been reported before, and according to an embodiment of the present invention a metal film can be easily formed from an organic metal material containing β-diketone ligands. These principles can be applied to all metals that form a β-diketone complex. All metals to which β-diketone can be coordinated are covered by the present invention, but specifically the present invention can be applied to the formation of metal films from such 8B, 1B and 2B family elements as Pt, Pd, Rh, Ru, Ir, Ni, Ag and Au, among others. The present invention can also be applied to other metals to which β-diketone coordinates, such as Ti, Ta, Hf, Nb, Mo, W, Mn, Mg, Sr, Ba and La, among others.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

BRIEF DESCRIPTION OF THE SYMBOLS

Figure 1:
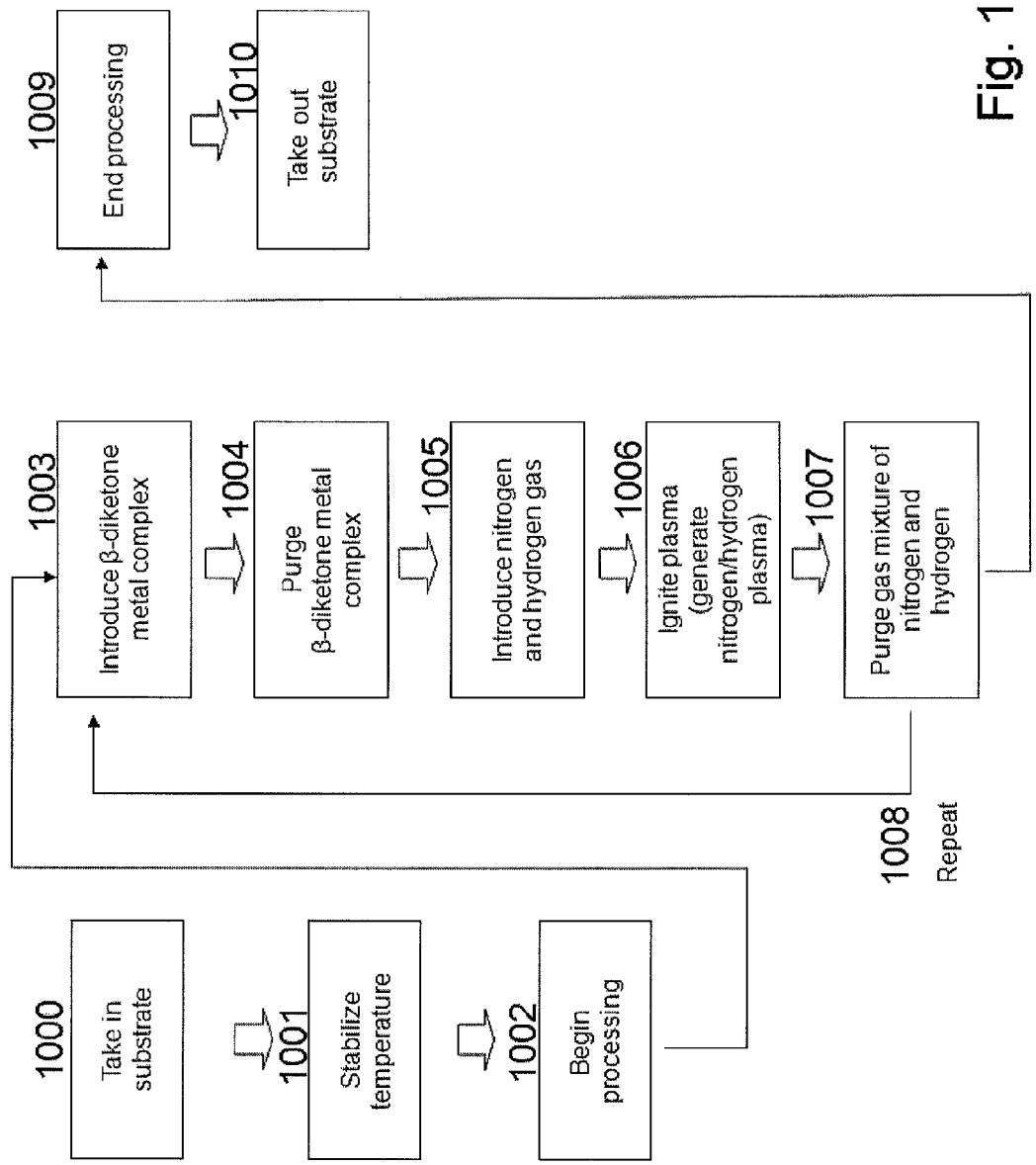
FIG. 1 is an explanation drawing showing an ALD process used in an embodiment of the present invention where an organic metal complex containing β-diketone ligands is used.

1000: Step to transfer substrate in
1001: Temperature stabilization step
1002: Process starting step
1003: Step to introduce organic metal complex containing β-diketone ligands
1004: Step to purge organic metal complex containing β-diketone ligands
1005: Step to introduce mixture gas of nitrogen and hydrogen
1006: Application of plasma (generation of nitrogen/hydrogen plasma)
1007: Purging of mixture gas of nitrogen and hydrogen
1008: Repeat of steps 1003 to 1007
1009: Process ending step
1010: Step to transfer substrate out
301: Reactor
302: Shower head
303: Substrate heating base
304: Evacuation
305: Pressure regulation valve
306: Substrate
307: Gas introduction pipe connected to shower head
308: Valve for argon gas used for purge
309: Cu material introduction valve
310: Orifice
311: Valve for argon gas used for purge
312: Co material introduction valve
313: Orifice
314: Gas introduction valve
315: Orifice
316: Gas introduction valve
317: Orifice
318: Gas introduction valve
319: APR
320: MFC
321: Bypass valve
322: Ar gas introduction valve
323: Cu material supply valve
324: Cu material bottle
325: Cu material
326: APR
327: MFC
328: Bypass valve
329: A carrier introduction valve
330: Co material supply valve
331: Co material bottle
332: Co material
333: APR
334: MFC
335: APR
336: MFC
337: APR
338: MFC
101: Bottom-layer copper wiring
102: SiCN Cu diffusion barrier—Insulation film
103: Inter-layer insulation film
104: Etching stopper film
105: Inter-layer insulation film
106: Etching stopper layer
107: Via hole in dual damascene structure
108: Trench in dual damascene structure
109: Cu diffusion barrier metal film
110: Co film
111: Cu film
112: Cu plating film
113: Cu wiring
501: Cassette loader
502: Transfer robot
503: Load lock chamber
504: Vacuum robot
505: Reaction chamber for Cu deposition
506: Reaction chamber for Co deposition
507: Reaction chamber for formation of Cu barrier metal film
508: Ar gas supply
509: Cu material supply
510: Co material supply
511: Hydrogen gas supply
512: Cu material supply line
513: Co material supply line
514: $H_2$ gas supply line
515: Nitrogen gas supply
516: Nitrogen gas supply line
401: Bottom-layer copper wiring
402: SiCN Cu diffusion barrier—Insulation film
403: Inter-layer insulation film
404: Etching stopper film
405: Inter-layer insulation film
406: Etching stopper layer
407: Via hole in dual damascene structure
408: Trench in dual damascene structure
409: Cu diffusion barrier metal film
410: Ru film
411: Cu film
412: Cu plating film
413: Cu wiring

DETAILED DESCRIPTION

The present invention will be explained with reference to embodiments. However, the embodiments are not intended to limit the present invention.

In the present disclosure where conditions and/or structures are not specified, the skilled artisan in the art can readily provide such conditions and/or structures, in view of the present disclosure, as a matter of routine experimentation.

An embodiment of the present invention provides a method of forming a single-metal film on a substrate by plasma atomic layer deposition (ALD), comprising: (i) contacting a surface of a substrate with a β-diketone metal complex in a gas phase, whereby molecules of the β-diketone metal complex are attached to the surface of the substrate; (ii) exposing the molecule-attached surface to a nitrogen-hydrogen mixed plasma, thereby forming an atomic layer of the metal; and (iii) repeating steps (i) and (ii) for a next atomic layer on top of the atomic layer in step (ii), thereby accumulating the atomic layers to form the single-metal film on the substrate. In an embodiment, the β-diketone metal complex can easily be adsorbed onto any surface, and the nitrogen-hydrogen plasma can quickly and completely cleave the coordinate bonds between the metal and the β-diketone(s), thereby efficiently forming the single-metal film. In an embodiment, no other ligand-supplying compounds are used, or no other plasma is used.

Further, embodiments include, but are not limited to, the followings:

In an embodiment, the single-metal film is an elemental metal film.

In an embodiment, the nitrogen-hydrogen mixed plasma may be produced by supplying a gas containing nitrogen and hydrogen, followed by applying RF power to the gas. In an embodiment, the gas containing nitrogen and hydrogen may be a mixture of nitrogen gas and hydrogen gas. Further, in an embodiment, a volumetric ratio of nitrogen to the gas mixture maybe 1/100 to 50/100.

In any of the foregoing embodiments, the metal constituting the β-diketone metal complex may be selected from the group consisting of metals belonging to Group 8, 1B, and 2B in the periodic chart. In an embodiment, the metal may be selected from the group consisting of Ru, Co, Pd, Pt, and Ir. Alternatively, the metal may be Cu. In an embodiment, the β-diketone metal complex may be constituted by three β-diketones coordinated to a metal in its molecule. In an embodiment, the β-diketone metal complex may have only β-diketone(s) (optionally substituted) coordinated to a metal in its molecule.

In any of the foregoing embodiments, the method may further comprise forming a Cu film on the single-metal film. In an embodiment, the Cu film may be formed using the single-metal film formed by steps (i) to (iii) as a Cu seed layer.

In any of the foregoing embodiments, steps (i) and (ii) may be repeated at least 10 times.

In any of the foregoing embodiments, steps (i) and (ii) may be repeated until a thickness of the single-metal film reaches at least 0.4 to 0.5 nm.

In any of the foregoing embodiments, the surface of the substrate on which the single-metal film is formed may be constituted by a Cu barrier layer.

In any of the foregoing embodiments, steps (i) and (ii) may be conducted at a temperature of 300° C. or lower.

In any of the foregoing embodiments, the method may further comprise purging the β-diketone metal complex gas after step (i) and purging the gas containing nitrogen and hydrogen after step (ii).

In any of the foregoing embodiments, the nitrogen-hydrogen plasma may be the only plasma to which the molecule-attached surface is exposed in step (ii).

In any of the foregoing embodiments, the β-diketone metal complex may be the only metal compound contacting the surface of the substrate in step (i).

In any of the foregoing embodiments, the single-metal film may have a purity of 99% or higher.

In any of the foregoing embodiments, the surface of the substrate on which the single-metal film is formed may have trenches and the single-metal film covers the trenches as a conformal coating.

Embodiments of the present invention are explained further below.

By causing an organic metal complex containing β-diketone ligands to be adsorbed onto a substrate and then processing this substrate using a gas containing at least hydrogen atoms and nitrogen atoms that have been activated by high frequency, β-diketone ligands can be removed efficiently. These hydrogen atoms and nitrogen atoms can be supplied by the same molecule, or by different molecules. Unless a special circumstance exists, however, even a normal mixture gas of hydrogen gas and nitrogen gas can remove β-diketone ligands with sufficient effect.

Figure 11C:
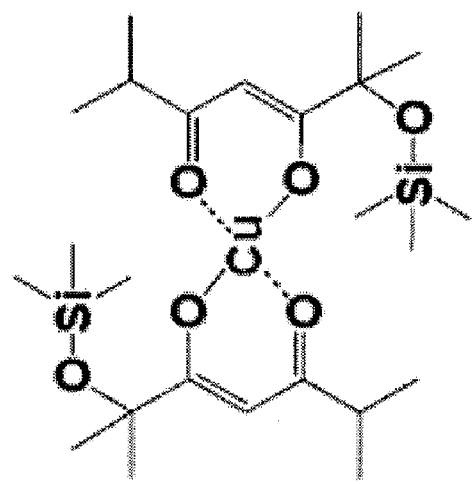
FIGS. 11A, 11B and 11C show the chemical structures of Cu complexes containing β-diketone ligands that can be used in an embodiment of the present invention.
Figure 11B:
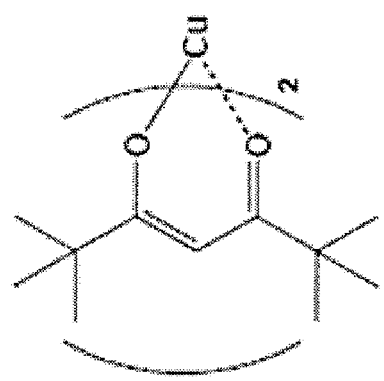
Figure 11A:
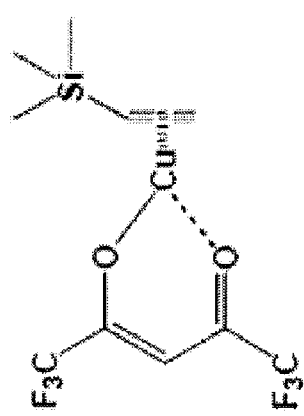

As for metal elements that can be coordinated to β-diketone and usable in an embodiment of the present invention, desirable examples include 8B, 1B and 2B family elements, or typically Fe, Ni, Rh, Pd, Ir, Pt, Co, Ru and Cu, among others, where each of the foregoing metals can have least one, or even two, three or more β-diketone coordinated to it. Using the aforementioned metals, a metal film of high purity (such as 99% or more, or even 99.9% or more in which case the film virtually consists of the applicable metal only) can be formed that does not easily produce nitrides when exposed to hydrogen/nitrogen plasma. Typical metal complexes coordinated to β-diketone include tridipivaloylmathanatocobalt ($DPM_3CO$), tridipivaloylmathanatoruthenium ($DPM_3Ru$) and copper hexafluoroacetylacetonate trimethylvinylsilane (Cu(hfac)tmvs) (FIG. 11A), among others, and other copper complexes having the structures shown in FIGS. 11B and 11C are also available. However, the present invention is not limited in any way to these metal complexes. Incidentally, basically organic metal complexes where only β-diketone is coordinated are favorable because they can eliminate ligands more effectively through hydrogen/nitrogen plasma. However, Cu(hfac)tmvs and some other complexes having both β-diketone and other ligands also undergo a change in molecular stability as β-diketone in the organic metal complex is eliminated, and consequently the molecule breaks down more easily. Accordingly, in an embodiment the organic metal complex can have a different ligand or ligands other than β-diketone. Those skilled in the art should be able to understand which compounds are appropriate based on the descriptions provided herein, and obtain such compounds. For a Ru complex, etc., for example, the compounds described in U.S. Patent Application Publication No. 2008/0054472 and No. 2008/0124484 and U.S. patent application Ser. No. 12/203,405 owned by the same assignee as in the present application (the disclosure of each of which is herein incorporated by reference in its entirety with regard to metal complexes), among others, can be used in an embodiment, in addition to the compounds mentioned above.

Depending on the application, metal elements having one or more β-diketone coordinated to them, other than the metal elements mentioned above, such as Ti, Ta, Hf, Nb, Mo, W, Mn, Mg, Sr, Ba and La, can be used in an embodiment.

In an embodiment of the present invention, a metal layer (single metal layer) constituted by a β-diketone coordinated metal complex can be formed in combination with other metal layer, for example, by using a Cu barrier film as the foundation layer. In an embodiment, a metal layer constituted by a β-diketone coordinated copper complex can be formed as a Cu seed film provided before a Cu film is formed. For this Cu barrier film, any known Cu barrier film or other appropriate film can be used. For example, PVD-TaN and CVD-Ru, as well as other films produced by ALD such as WNC, WN, TaN, RuTaN, RuTa, TaNC, RuTaNC, TiN, RuTiN and RuTi, can be used. In addition to the above, films that can be combined in a favorable manner with a metal layer constituted by β-diketone coordinated metal complex (as the bottom layer or top layer) include, for example, the metal films and alloy films described in U.S. patent application Ser. Nos. 12/203,405 and Ser. No. 12/201,434 owned by the same assignee as in the present application (the disclosure of each of which is herein incorporated by reference in its entirety with regard to metal films). In particular, the aforementioned combinations with metal films by ADL method are desirable because they allow the films to be formed continuously in the same reaction chamber and also offer excellent adhesion. Take note that, in an embodiment, a single metal layer can be formed directly on the substrate surface. In other words, the present invention covers all surfaces without limitation, as long as a β-diketone coordinated metal complex can be adsorbed onto the surface.

After a single metal layer using, say, Ru or Co has been formed on top of a Cu barrier film, a Cu seed layer is formed, for example. This Cu seed layer can be formed by PVD, etc., or according to an embodiment of the present invention using a β-diketone coordinated Cu complex. Ru and Co offer excellent adhesion to Cu and therefore allow the single metal layer and Cu seed layer to be formed continuously on top of a Cu barrier film. In an embodiment, the single metal layer in the aforementioned structure consists of one layer.

In an embodiment of the present invention, the method described in U.S. patent Ser. No. 12/203,405 owned by the same assignee as in the present application (the disclosure of which is herein incorporated by reference in its entirety with regard to ALD process conditions), among others, can be used. In the aforementioned embodiment, no alloy film is formed, but a film constituted by one type of metal is formed. In an embodiment of the present invention, laminated layers can be formed where said layers consist of virtually only one type of metal because β-diketone ligands are severed by nitrogen/hydrogen plasma. Take note, however, that some metal elements other than those in the 8B, 1B and 2B families (such as Ta) form nitrides when exposed to nitrogen/hydrogen plasma, even when nitrogen/hydrogen plasma severs β-diketone ligands, in which case the resulting film does not have a metal purity of 99% or more even when only one type of metal is used.

The thickness of this single metal layer varies depending on the application, but in an embodiment it is in a range of 0.5 to 100 nm (or 1 nm or more but 20 nm or less, such as in a range of 1 to 10 nm or 5 to 20 nm, in an embodiment). If the film is too thin, the single metal layer cannot demonstrate its properties. Theoretically the film thickness can be increased infinitely. The severance of β-diketone ligands by nitrogen/hydrogen plasma occurs much more quickly and reliably compared to, say, when hydrogen plasma alone is used. As a result, while the cycle needs to be repeated around 10 times to form one atomic layer before (for example, one cycle forms only 0.02 nm of Ru film and thus formation of one atomic layer requires 10 cycles to be repeated to achieve a thickness of approx. 0.2 nm), in an embodiment of the present invention around 0.04 to 0.05 nm of film can be achieved in one cycle, which is twice the rate compared to before, and therefore a 10-cycle achieves 0.4 to 0.5 nm of film corresponding to two or three atomic layers. A thickness corresponding to two or three atomic layers can be definitely recognized as a metal layer.

In an embodiment, the resistivity is not more than 5 times, or not more than twice, the resistivity of a bulk film formed by the same metal. In typical examples, the resistivity is 50 μΩcm or less, or even 20 μΩcm or less. Incidentally, although the resistivity of a single metal layer is slightly higher than that of a bulk film (complete crystallization), this is because the single metal layer is thin and the film forming temperature is low, or 300° C. or below, and therefore complete crystallization cannot be achieved as in the case of a bulk film. In other words, the resistivity can be lowered by heat-treating the single metal layer at high temperature. The aforementioned resistivity values assume use of no high-temperature treatment.

Examples of $H_2/N_2$ plasma and $H_2$ plasma conditions are listed below:
Pressure: 150 to 400 Pa
Temperature: 250 to 300° C.
$H_2$ flow rate: 100 to 500 sccm
$N_2$ flow rate: 10 to 200 sccm
$N_2/(N_2+H_2)$ ratio: 1/100 to 50/100
RF power: 200 to 500
RF frequency: 1 to 30 MHz
Application time: 1 to 20 (per cycle)

As for the $N_2/(N_2+H_2)$ ratio mentioned above, surprisingly even only a small amount of $N_2$ causes significant changes in film quality, and in an embodiment, sufficient effects can be achieved as long as the $N_2/(N_2+H_2)$ ratio is 1/1000 or more.

$NH_3$ plasma can also be used (such as at 10 to 200 sccm) instead of $H_2/N_2$ plasma.

Also note that the cycle conditions under which to introduce a β-diketone coordinated metal complex and to cause it to adsorb onto the substrate surface can be set as follows in an embodiment, although specific conditions vary depending on the type of β-diketone coordinated metal complex:
Pressure: 150 to 400 Pa
Substrate temperature: 250 to 300° C.

The purge conditions using an inert gas (such as He or Ar) can be set as follows, for example:
Inert gas flow rate: 500 to 2000 sccm
Time: 1 to 3 sec In the above, normally evacuation is also performed along with purge.

FIG. 1 shows the steps to implement the ALD metal film forming method using an organic metal complex containing β-diketone ligands according to an embodiment of the present invention. The ALD process consisting of steps 1000 to 1010 forms a metal film. The steps according to this embodiment are explained one by one using FIG. 1.

A substrate is introduced to an ALD apparatus that has been evacuated, and the substrate temperature is set to and stabilized at a specified level, after which the ALD process is started. Normally, first an organic metal complex containing β-diketone ligands is introduced onto the substrate, and then the organic metal complex coordinated by a β-diketone complex is discharged. This discharge is preferably be implemented in such a way that an inert gas is introduced under evacuation to discharge the gas of this organic metal complex from the reaction chamber. Once a specified vacuum level is achieved, high frequency is applied to the mixture gas using a high-frequency power supply to activate the mixture gas and thereby produce a so-called plasma gas, and this plasma gas is used to eliminate β-diketone groups from the organic metal complex containing β-diketone ligands and adsorbed onto the substrate surface. At this time, an elimination from the organic metal complex containing β-diketone ligands can be achieved very effectively by using as a plasma gas a mixture gas of hydrogen and nitrogen where the two constitutes are mixed at a specified ratio. As a result, a metal film at the atomic layer level is formed. Next, the mixture gas of hydrogen and nitrogen is discharged. This discharge can also be achieved by supplying an inert gas. Thereafter, steps 1003 to 1007 are repeated to achieve a specified film thickness (1008). Normally this method forms approx. 0.5 Å of metal film of per cycle, which means that a metal film having the required film thickness can be formed after 20 to 100 cycles or so. After the ALD cycle has been repeated for a specified number of times, normally the atmosphere is evacuated sufficiently and then the substrate is transferred out of the ALD apparatus, upon which the process ends. Needless to say, if the next process is performed in vacuum, then the substrate is also transferred in vacuum.

Figure 10:
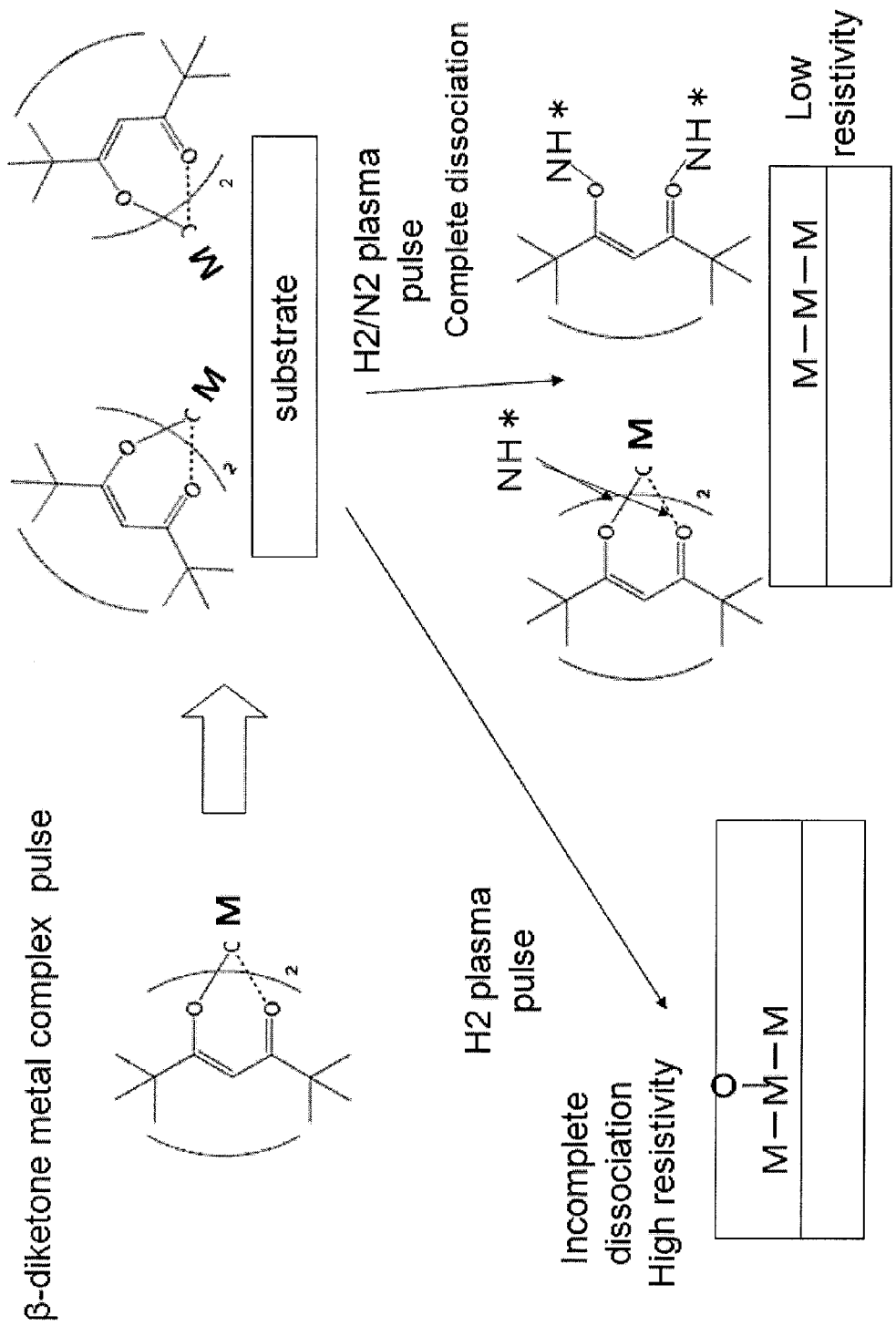
FIG. 10 is a schematic explanation drawing showing the mechanism of how a single metal film is formed from a metal complex containing β-diketone ligands according to an embodiment of the present invention.

FIG. 10 shows the mechanism of how an atomic layer is formed in an embodiment of the present invention. Shown here is an example of a complex where β-diketone is coordinated to two metals (M). The β-diketone coordinated metal complex is adsorbed onto the substrate, after which nitrogen/hydrogen plasma is used to sever the ligand bonds between the metals and β-diketone, thereby virtually causing metal alone to be deposited onto the substrate. β-diketone that has been severed from the ligand bonds then bonds with nitrogen/hydrogen and is thus purged from the reaction chamber. Since the decomposition of the β-diketone metal complex by nitrogen/hydrogen plasma is extremely quick and reliable, in an embodiment the deposition rate of metal atoms reaches as much as twice the rate achieved when hydrogen plasma is used, in which case the number of cycles needed to form one atomic layer is reduced to about a half. Also, the deposited metal atoms have been fully separated from β-diketone and do not have any other bond, which allows a virtually pure metal layer to be formed. As a result, a metal layer having low resistivity can be achieved. Incidentally, some metals such as Ta have the property to easily bond with nitrogen even after β-diketone has been separated reliably and quickly. As a result, if Ta is used, then a TaN layer is obtained instead of a pure metal layer. On the other hand, hydrogen plasma cannot fully separate ligand bonds of β-diketone and metal and thus some bonds remain on the substrate. Because of this, the resulting film has high resistivity. Also, decomposition reaction occurs slowly and thus the deposition rate becomes only one half the rate achieved when nitrogen/hydrogen plasma is used. In an embodiment of the present invention, only a β-diketone metal complex is used as the material and no other compound proving ligands nor additional process such as ligand exchange is required.

Figure 2:
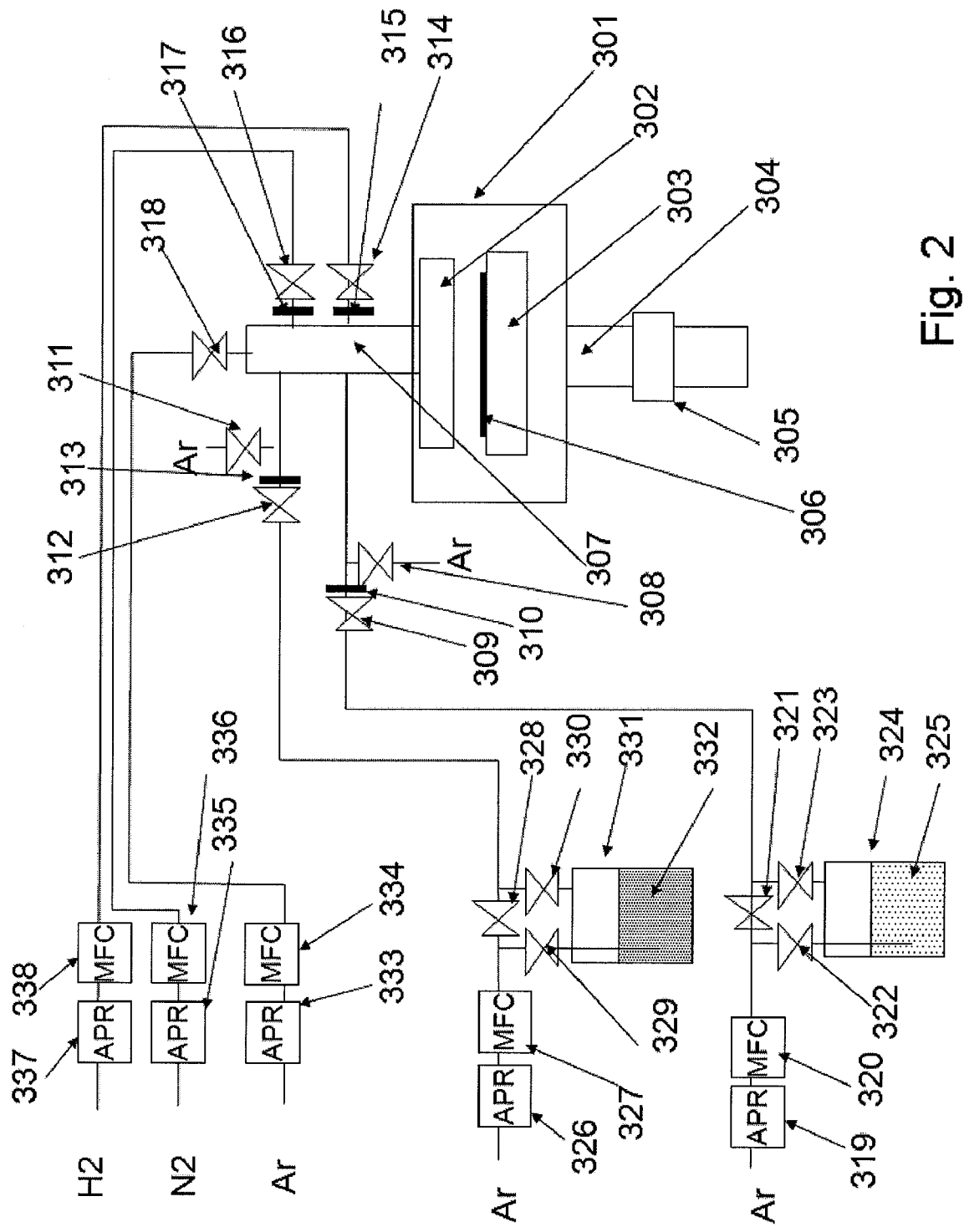
FIG. 2 is a schematic drawing showing an ALD apparatus used in an embodiment of the present invention, capable of forming a film from an organic metal complex containing β-diketone.

FIG. 2 shows an ALD apparatus for forming a metal film using an organic metal complex containing β-diketone ligands. This apparatus comprises a reactor 301 in which a substrate heating base 303, evacuation 304, shower head 302, gas introduction pipe 307 connected to the shower head, substrate 306, exhaust pipe 304 and pressure regulation valve 305 are housed. The gas introduction system comprises a system to supply the first organic metal complex containing β-diketone ligands, system to supply the second organic metal material, $H_2$ gas supply, $N_2$ gas supply and Ar gas supply system. First, the configuration of the system to supply the first organic metal complex containing β-diketone ligands is explained. 319 represents an APR, or Auto Pressure Regulator, which is used to control the pressure on the secondary side at a specified level. 320 represents a MFC (Mass Flow Controler) used to control the flow rate at a constant level. The system to supply the first organic metal complex containing β-diketone ligands is indicated by 325, which is loaded in a material tank 324 and comprised of an Ar gas introduction valve 322, bypass valve 321 and material supply valve 323. 309 represents a valve to introduce organic metal complex containing β-diketone ligands, while 310 represents an orifice and 308 represents a valve to introduce argon gas for dilution or purge. When the material vapor pressure in the material tank 324 is transported by the argon gas supplied at a constant pressure, the valve 309 opens and the material is then fed to the gas introduction pipe 307 through a specified gas introduction hole in the orifice at an appropriate flow rate according to the pressure set by the APR 319.

Figure 4:
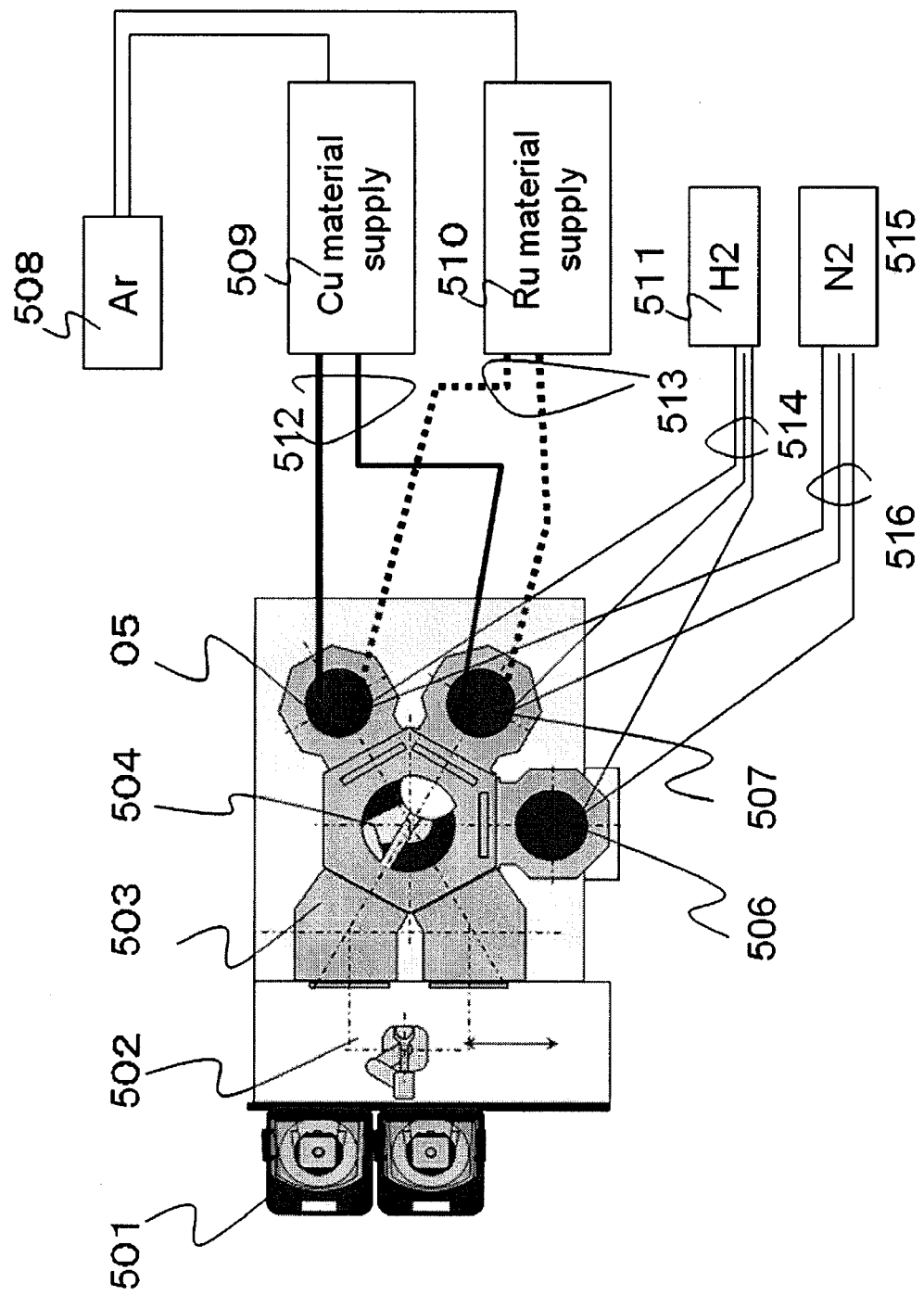
FIG. 4 is a schematic plan view showing the configuration of an apparatus capable of forming Ru and Cu films using Ru and Cu complexes containing β-diketone ligands, according to an embodiment to the present invention.

Next, the $H_2$, $N_2$ and Ar gas supply systems are explained using FIG. 4. As for the gases supplied by pulsing actions and applied in the plasma ALD process, 333, 335 and 337 each representing an APR (Auto Pressure Control) and 334, 336 and 338 each representing a MFC (Mass Flow Control) are connected in series, respectively, just like the system to supply organic metal complex containing β-diketone ligands, where each pair of APR and MFC is connected to gas introduction valves 314, 316 and 318. Orifices 315, 317 are installed in the hydrogen and nitrogen lines, where each orifice has an introduction hole to allow a specified supply flow rate to be achieved quickly. No orifice is shown for the introduction valve denoted by 318, but it is effective to also install an orifice at this valve if a specified supply flow rate is to be achieved quickly. The configurations of the ALD apparatus and gas systems need not be the same as those mentioned above, and any other configuration can be used as long as it is designed for a similar purpose, and such other configuration can also achieve a similar effect.

Next, specific application examples are given. It should be noted, however, that these application examples are only a part of embodiments and the present invention is not limited to these examples in any way.

Figure 3:
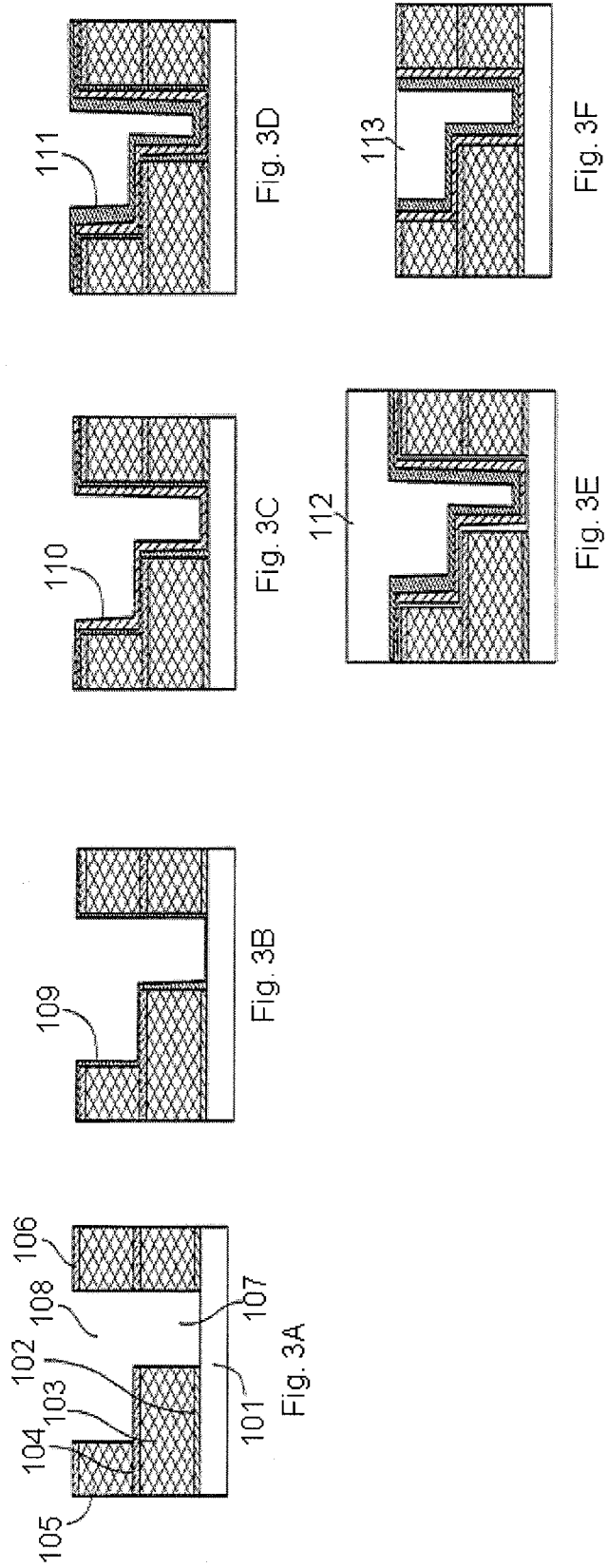
FIGS. 3A to 3F are schematic cross-section views showing steps to use the apparatus in FIG. 2 to form a lamination film using a Co complex containing β-diketone ligands over Cu wirings of dual damascene structure, according to an embodiment of the present invention.

First, it should be mentioned that in connection with next-generation Cu wirings that require extremely thin Cu barrier films, Cu barrier metal films formed by the ALD method, such as TaN and TiN films, are being examined in the industry. However, these films do not have good adhesion to Cu film and therefore a Co, Ru or other film offering excellent adhesion to Cu is required between the Cu barrier film and Cu film. FIGS. 3A to 3F illustrate an example of steps constituting a wiring forming method in which a Co film is formed on top of a PVD-TaN barrier film, after which a Cu film is formed by PVD, and then a Cu film is formed by electroplating. In an embodiment of the present invention, the ALD method using an organic metal complex containing Co having β-diketone ligands, and plasma generated by a mixture gas of hydrogen and nitrogen, can be used to form a Co film as shown in FIG. 3C.

First in FIG. 3A, a Cu diffusion barrier insulation film 102, inter-layer insulation film 103, etching stopper film 104, inter-layer insulation film 105 and etching stopper film 106 are laminated on a bottom-layer Cu wiring 101, and a via hole 107 and wiring 108 are also present in the dual damascene structure. Next in FIG. 3B, a Cu diffusion barrier film 109 is formed. This diffusion barrier can be formed by the PVD method, or by the CVD method or ALD method. In FIG. 3C, a material containing β-diketone group ligands, such as tridipivaloylmathanatocobalt ($DPM_3CO$), is supplied onto this Cu diffusion barrier film, after which a mixture gas of hydrogen and nitrogen is used to form a Co film 110 via ALD according to the sequence shown in FIG. 1. Next in FIG. 3D, a Cu film 111 is formed, for example, by the PVD method, and this film is used as a seed layer to form a Cu film 112 via electroplating in FIG. 3E, after which the Cu film is flattened by CMP and a Cu wiring 113 is formed in FIG. 3F. This way, a Co layer can be formed underneath the Cu film, which achieves good adhesion between the Cu film and the layer below it and therefore high reliability can be ensured.

FIG. 4 shows an apparatus applied to the forming of a Ru/Cu lamination structure using Ru and Cu complexes containing β-diketone ligands. This apparatus comprises a cluster apparatus 500, wafer cassette loader 501, atmospheric transfer robot 502, load lock chamber 503, vacuum transfer robot 504, pre-processing reactor 506, barrier metal forming reactor 505 and Cu/Ru lamination forming reactor 507, while other components include an argon gas supply system 508, Cu material supply system 509, Ru material supply system 510, $H_2$ gas supply system 511, $N_2$ gas supply 515, Cu material supply line 512, Co material supply line 513, $H_2$ gas supply line 512 and $N_2$ gas supply line 516.

Figure 5A:
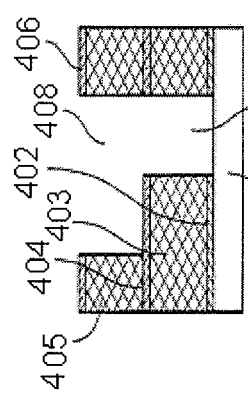
FIGS. 5A to 5F are schematic cross-section views showing steps to use the apparatus in FIG. 2 to form a lamination film of Ru and Cu films using Ru and Cu complexes containing β-diketone ligands over Cu wirings of dual damascene structure, according to an embodiment of the present invention.
Figure 5B:
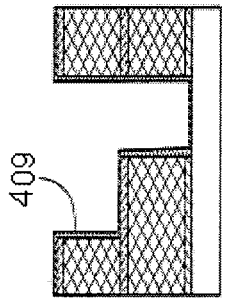
Figure 5C:
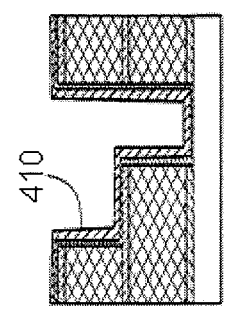
Figure 5D:
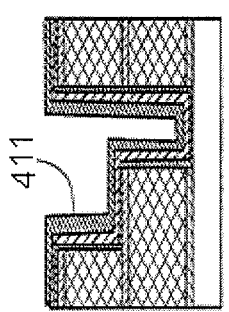
Figure 5E:
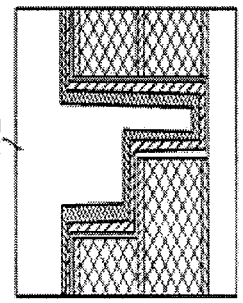
Figure 5F:
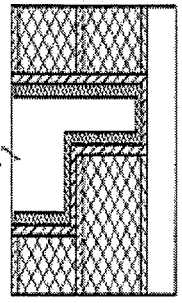

FIGS. 5A to 5F show the steps to continuously form a barrier metal, Ru film and Cu film in a dual damascene wiring structure using the apparatus shown in FIG. 4. In FIG. 5A, a Cu diffusion barrier insulation film 402, inter-layer insulation film 403, etching stopper film 404, inter-layer insulation film 405 and etching stopper film 406 are laminated on a bottom-layer Cu wiring 401, and a via hole 407 and wiring 408 are also present in the dual damascene structure. In FIG. 5B, first a Cu diffusion barrier film 409 is formed. This diffusion barrier can be formed by the PVD method, or by the CVD method or ALD method. Next in FIG. 5C, a Ru film 410 is formed on top of this Cu diffusion barrier film 409, after which a Cu film 411 is formed in FIG. 5D. Furthermore in FIG. 5E, a Cu film 412 is formed via electroplating, after which the film is flattened by CMP in FIG. 5F and a Cu wiring 413 is formed. These forming steps can be implemented continuously using the cluster apparatus shown in FIG. 4. Incidentally, in FIG. 5C a material containing β-diketone group ligands, such as tridipivaloylmathanatoruthenium (DPM$_3$Ru), is supplied onto this Cu diffusion barrier film 409, after which a mixture gas of hydrogen and nitrogen is used to form a Ru film 410 via ALD according to the sequence shown in FIG. 1. Next in FIG. 5D, similarly a material containing β-diketone group ligands, such as Cu(hfac)tmvs, is used and a mixture gas of hydrogen and nitrogen is used to form a Cu film 411 via ALD. Since the Cu seed layer and the layer below it can both be formed as atomic layers using β-diketone metal complexes, good adhesion to the Cu film can be achieved and low resistivity and high reliability can be ensured.

Also, the substrate is transferred to 506 via the cassette loader 501, and in 506 the surface of the bottom-layer Cu wiring 401 at the via hole 407 is reduced by hydrogen plasma, after which the substrate is transported to the processing chamber 505 and a copper diffusion barrier metal film is formed. This metal film can be formed by the PVD method, CVD method or ALD method. The specific film is a TaN, RuTaN, TiN, RuTiN or other metal film that serves as a Cu diffusion barrier. Thereafter, the substrate is transferred to the processing chamber 507, where a Ru material constituted by a metal complex containing β-diketone ligands is evaporated and supplied to form an extremely thin Ru film of 1 to 2 nm in thickness through the cycle shown in FIG. 1. Furthermore, a Cu material constituted by a metal complex containing β-diketone ligands is evaporated and supplied to form a Cu film of 1 to 10 nm in thickness through the cycle shown in FIG. 1. As explained above, both Ru and Cu films can be formed in the same module. This way, a Cu/Ru lamination film can be formed via ALD at the same low temperature. This is possible because, by using plasma generated by a mixture gas of hydrogen and nitrogen, Ru and Cu films can be formed easily at low temperature. Similarly, these Ru and Cu layers can also be formed repeatedly to form a structure of mixed Ru/Cu layers.

Detailed examples are given below.

EXAMPLE 1

In this example, a process of forming a Co film is illustrated. Using the ALD apparatus shown in FIG. 2, an inter-layer connection structure using a Co film was formed according to the steps shown in FIGS. 3A to 3F.

In FIG. 2, the heating base 303 in the processing chamber 301 was set to 300° C. The Co material 325, or tridipivaloylmathanatocobalt (DPM$_3$CO), was filled in a bottle 324 and this bottle was heated to 120° C. This Co material 325 had a vapor pressure of 0.5 torr, and vapor of the Co material was supplied by an argon carrier gas to a substrate via a valve 309 and orifice 310. After the Co material was supplied for 1 to 3 seconds, or desirably 1 second, this Co material was purged by the argon gas supplied from a valve 318, after which N$_2$ was supplied by 50 sccm from a valve 316 and orifice 317, followed by the supply of H$_2$ by 200 sccm from a valve 314 and orifice 315. High frequency power of 200 to 500 W and 13.56 MHz was then applied to this mixture gas and the excited plasma was used to eliminate β-diketone ligands from the Co material molecules having β-diketone ligands and adsorbed onto the substrate. Although the plasma application time varies depending on the high-frequency output, good reaction could be achieved after approx. 1 to 3 seconds at 400 W. After the plasma was stopped, a mixture gas of hydrogen and nitrogen was purged. Such cycle was repeated for specified times. Normally 0.5 Å is deposited per cycle, so 20 cycles should be repeated to form 1 nm of film. Normally, a Co film with a thickness of approx. 1 to 2 nm could be formed. Whether this reaction is acceptable or not can be determined from the resistivity of the formed Co film. The Co film obtained under the above conditions had a resistivity of 20 μΩcm or less.

Figure 6:
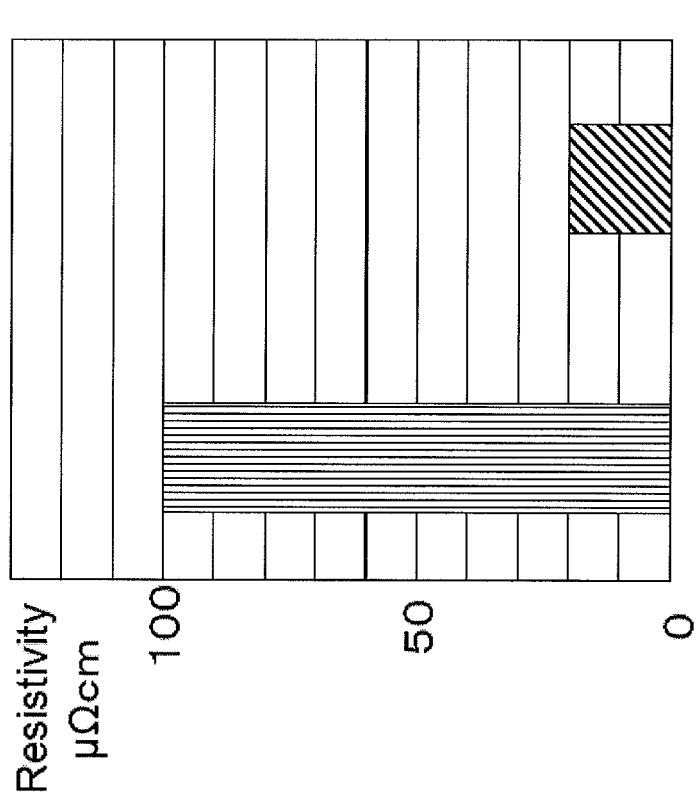
FIG. 6 is a graph showing the dependence of resistivity on plasma gas when a Co film was formed by the ALD method using a Co complex containing β-diketone ligands according to an embodiment of the present invention.

FIG. 6 shows the relative resistance levels obtained when only H$_2$ plasma was used and a mixture gas of H$_2$ and N$_2$ was used. As shown, the resistivity dropped to 1/5 under the same plasma condition (400 W) and plasma application time (3 seconds).

Incidentally, after the aforementioned process the substrate was transferred from the reactor to the next process, or Cu forming process, where the steps in FIGS. 3E and 3F were implemented.

EXAMPLE 2

In this example, an inter-layer connection structure was formed through the procedure shown in FIGS. 5A to 5F using a process of forming Ru and Cu films continuously in the same reaction chamber. In the ALD apparatus shown in FIG. 2, one material 325 is a Ru material containing β-diketone ligands, while the other material 332 is a Cu material containing β-diketone ligands.

A substrate was transferred to the reaction chamber, and first in FIG. 2 the heating base 303 in the processing chamber 301 was set to 300° C. The Ru material, or tridipivaloylmathanatoruthenium (DPM$_3$Ru) 325, was filled in a bottle 324, and this bottle was heated to 120° C. This Ru material 325 had a vapor pressure of 0.1 torr, and vapor of the Ru material was supplied by an argon carrier gas to the substrate via a valve 309 and orifice 310. After the Ru material was supplied for 5 to 10 seconds, or desirably 5 seconds, this Ru material was purged by the argon gas supplied from a valve 318, after which N$_2$ was supplied by 50 sccm from a valve 316 and orifice 317, followed by the supply of H$_2$ by 200 sccm from a valve 314 and orifice 315. High frequency power of 200 to 500 W and 13.56 MHz was then applied to this mixture gas and the excited plasma was used to eliminate β-diketone ligands from the Ru material molecules having β-diketone ligands and adsorbed onto the substrate. Although the plasma application time varies depending on the high-frequency output, good reaction could be achieved after approx. 5 to 15 seconds at 400 W. Whether this reaction is acceptable or not can be determined from the resistivity of the formed Ru film. The Ru film obtained under the above conditions had a resistivity of 20 μΩcm or less. This suggests that impurities arising from the Ru material could be reduced and a Ru metal film 410 of low resistivity (FIG. 5C) was formed.

Figure 7:
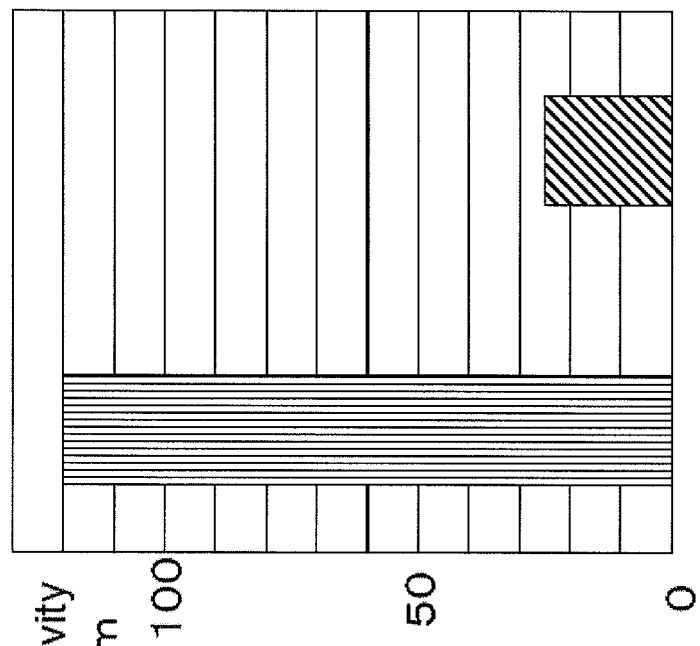
FIG. 7 is a graph showing the dependence of resistivity on plasma gas when a Ru film was formed by the ALD method using a Ru complex containing β-diketone ligands according to an embodiment of the present invention.
Figure 8:
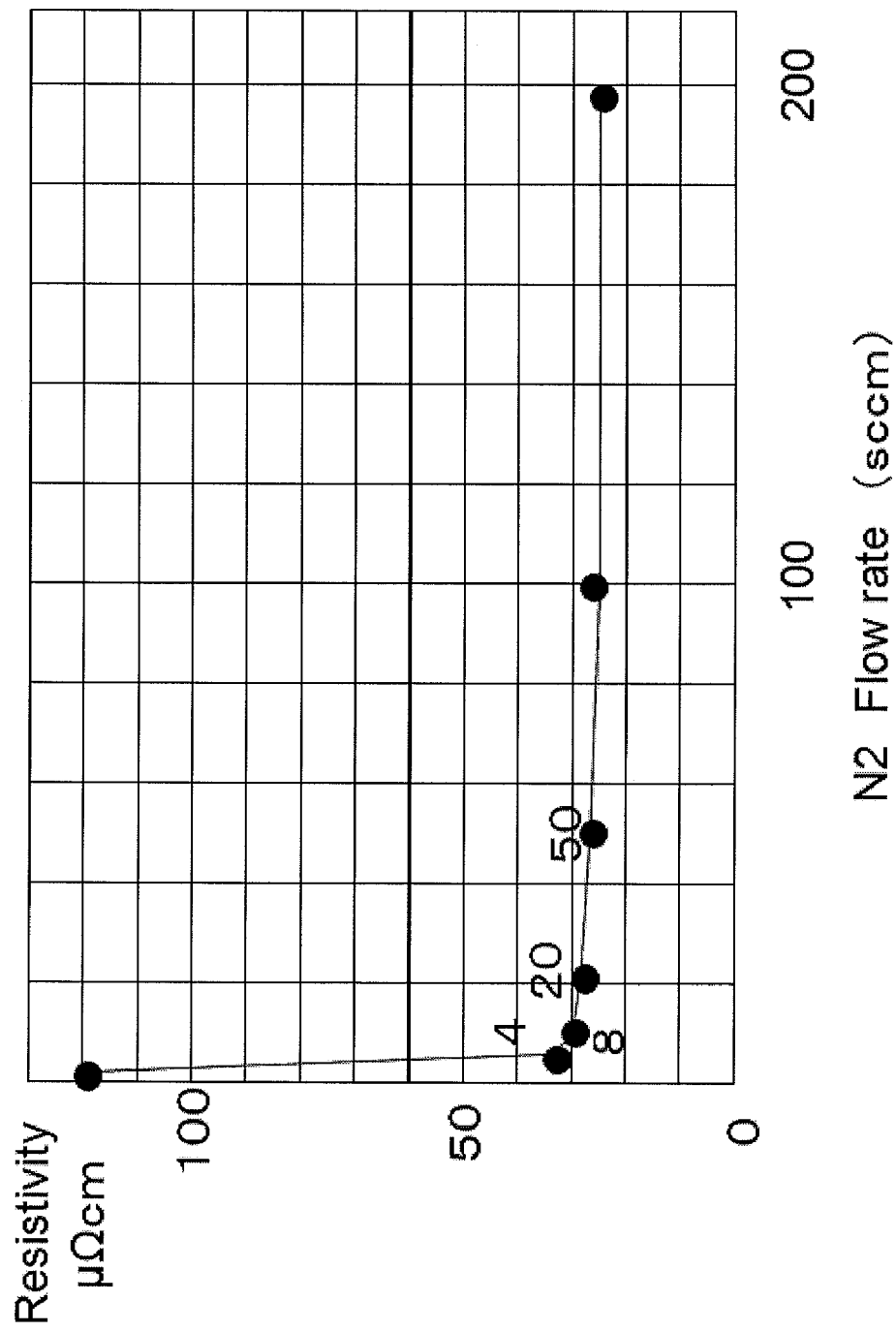
FIG. 8 is a graph showing the relationship of resistivity and nitrogen gas flow rate in an embodiment of the present invention.

FIG. 7 shows the resistivity levels obtained when only $H_2$ plasma was used and a mixture gas of $H_2$ and $N_2$ was used. As shown, the resistivity dropped to approx. 1/5 when the H2/N2 mixture gas was used. FIG. 8 shows the resistivity levels achieved when the flow rate of nitrogen was changed from 0 to 200 sccm at a constant hydrogen flow rate of 400 sccm. Since the resistivity dropped substantially when only 4 sccm of $N_2$ gas was introduced, it can be said that adding a small amount of $N_2$ to plasma would eliminate β-diketone ligands. Accordingly, sufficient elimination effects can be demonstrated as long as the flow rate of $N_2$ gas is 1% or more relative to the flow rate of $H_2$ gas.

Thereafter, a Cu material 332, or Cu(hfac)tmvs (copper hexafluoroacetylacetonate trimethylvinylsilane), was heated to 80° C. and supplied to form a Cu film 411 according to the sequence shown in FIG. 1. The Cu material 332 was filled in a bottle 331, and this bottle was heated to 800° C. This Cu material 325 had a vapor pressure of 0.5 torr or more, and vapor of the Cu material was supplied by an argon carrier gas to the substrate via a valve 312 and orifice 313. After the Cu material was supplied for 1 to 3 seconds, or desirably 1 second, this Cu material was purged by the argon gas supplied from a valve 318, after which $N_2$ was supplied by 50 sccm from a valve 316 and orifice 317, followed by the supply of $H_2$ by 200 sccm from a valve 314 and orifice 315. High frequency power of 200 to 500 W and 13.56 MHz was then applied to this mixture gas and the excited plasma was used to eliminate β-diketone ligands from the Cu material molecules having β-diketone ligands and adsorbed onto the substrate. Although the plasma application time varies depending on the high-frequency output, good reaction could be achieved after approx. 5 to 15 seconds at 400 W. Whether this reaction is acceptable or not can be determined from the resistivity of the formed Cu film. The Cu film obtained under the above conditions had a resistivity of 2 μΩcm or less.

Figure 9:
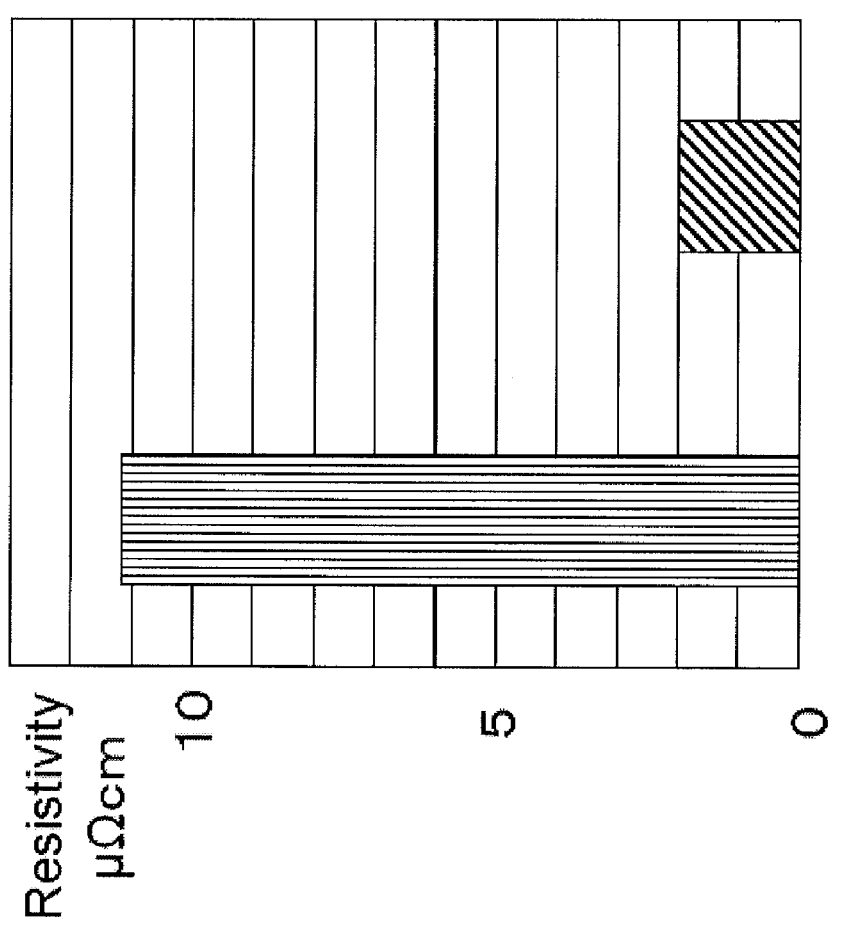
FIG. 9 is a graph showing the dependence of resistivity on reactant gas when a Cu film was formed by the ALD method using a Cu complex containing β-diketone ligands according to an embodiment of the present invention.

FIG. 9 compares the resistivity of a Cu film deposited using $H_2$ plasma alone against the resistivity of a Cu film deposited using a mixture gas of $H_2$ and $N_2$. As shown, the resistivity could be dropped to approx. 1/5 using the $H_2/N_2$ mixture gas. Although the film deposition rate varies depending on the plasma output, it is 0.1 to 0.5 Å per cycle, or preferably 0.5 Å per cycle. In other words, 1 to 5 nm of film needed as a Cu seed layer can be obtained after 20 to 100 cycles. A Cu film 412 can be formed on top of this Cu film 411 (FIG. 5D) via electroplating. Since this ALD formation of Ru and Cu films allows an extremely thin seed layer of low resistivity to be formed, electroplating can be implemented with ease. It was confirmed that by setting the Ru film thickness to 1 nm and Cu film thickness to 3 nm, via holes of 30 nm or less in diameter in a structure of 5 to 10 in aspect ratio could be fully buried by Cu plating.

Although a Cu film was formed after a Ru film in this example, a mixed layer structure constituted by multiple Ru and Cu layers can also be formed by alternating the Ru ALD cycle and Cu ALD cycle. In this case, it was possible to form a Ru layer for 10 cycles, form Ru and Cu layers alternately for 10 cycles each, and then form a Cu layer for 50 cycles. Here, too, the good Cu electroplating property allowed complete burying by Cu plating of via holes of 30 nm or less in diameter in a structure of 5 to 10 in aspect ratio.

EXAMPLE 3

This example illustrates a process of forming a RuTaN film as a Cu barrier layer and then forming Ru and Cu layers. In the ALD apparatus shown in FIG. 2, one material 325 is a Ru material containing β-diketone ligands, while the other material 332 is a Ta organic metal material.

A substrate was transferred to the reaction chamber, and first in FIG. 2 the heating base 303 in the processing chamber 301 was set to 300° C. The Ta material, or TAIMATA (tertiaryamylimidotris(dimethylamido)tantalum), was supplied for 1 second. Taimata was supplied by an Ar carrier gas from a bottle 331 heated to 80° C. Next, 50 sccm of $N_2$ was supplied from a valve 316 and orifice 317, and 200 sccm of $H_2$ was supplied from a valve 314 and orifice 315. High frequency power of 200 to 500 W and 13.56 MHz was then applied to this mixture gas and the excited plasma was used to break down the Taimata adsorbed onto the substrate into Ta atoms. Although the plasma application time varies depending on the high-frequency output, good reaction could be achieved after approx. 5 to 15 seconds at 400 W. Next, the Ru material 325, or tridipivaloylmathanatoruthenium ($DPM_3Ru$), was filled in a bottle 324, and this bottle was heated to 120° C. This Ru material 325 had a vapor pressure of 0.1 torr, and vapor of the Ru material was supplied by an argon carrier gas to the substrate via a valve 309 and orifice 310. After the Ru material was supplied for 1 to 10 seconds, or desirably 1 to 5 seconds, this Ru material was purged by the argon gas supplied from a valve 318, after which $N_2$ was supplied by 50 sccm from a valve 316 and orifice 317, followed by the supply of $H_2$ by 200 sccm from a valve 314 and orifice 315. High frequency power of 200 to 500 W and 13.56 MHz was then applied to this mixture gas and the excited plasma was used to eliminate β-diketone ligands from the Ru material molecules having β-diketone ligands adsorbed onto the substrate. Although the plasma application time varies depending on the high-frequency output, good reaction could be achieved after approx. 5 to 15 seconds at 400 W. This Ru material supply step was repeated twice, after which the Ta material was supplied again and the plasma processing step using $H_2/N_2$ gas was performed once. In the same manner, the "Ru supply step×2+ Plasma step" cycle was repeated 14 times. As a result, 2 nm of RuTaN film was formed.

Next, only the Ru material was supplied and the similar plasma processing step was implemented, and this was typically repeated for 20 to 40 times to form approx. 1 to 2 nm of Ru film. Whether the quality of the formed Ru film is acceptable or not can be determined from the film's resistivity. The Ru film obtained under the above conditions had a resistivity of 30 μΩcm or less. This suggests that impurities arising from the Ru material could be reduced and a Ru metal film 410 of low resistivity (FIG. 5C) was formed.

Figure 12:
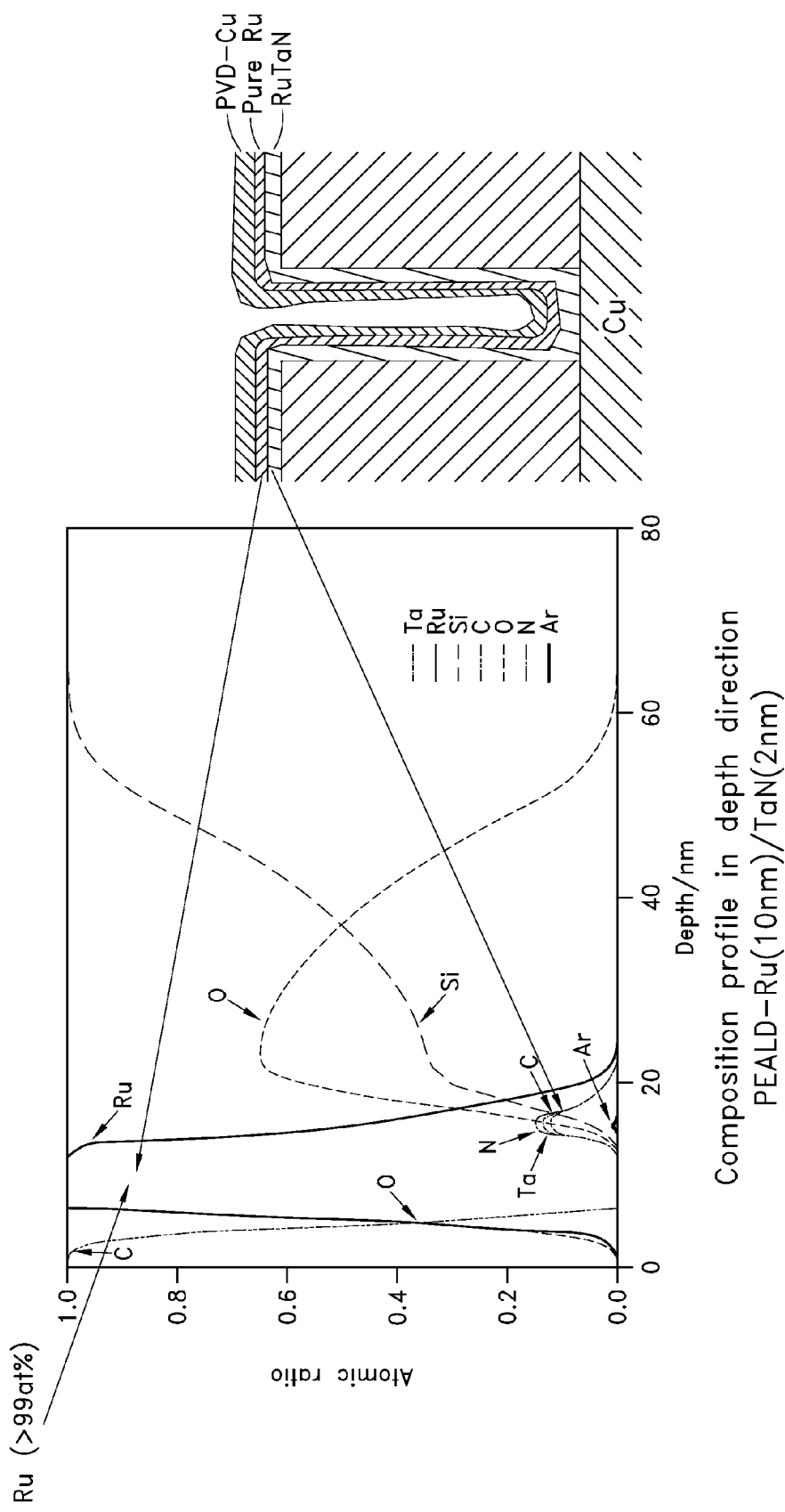
FIG. 12 is a graph showing the composition profile in the depth direction of a layer structure constituted by a TaN film and a metal layer laminated on top formed by a Ru complex containing β-diketone ligands according to an embodiment of the present invention.

The RBS analysis results shown in FIG. 12 were obtained by forming a RuTaN alloy of 2 nm in thickness according to the method explained above, forming a Ru film of 10 nm in thickness, and then analyzing the composition using the Rutherford backscattering method. Take note that although the schematic cross-section view of the trench shown in FIG. 12 also indicates a PVD-Cu seed layer at the top, the composition was analyzed when the Ru film was laminated on top of the RuTaN film formed as a Cu barrier layer. With any Ru film, it is difficult to analyze the composition unless the film thickness is approx. 10 nm, because oxygen and carbon in atmosphere adsorb to the Ru surface. In light of the above, except for boundary compositions, as can be seen, the amount of carbon and oxygen that entered the Ru film is only 1 atomic % or less, and the Ru film is at least 99% pure. This shows that, by forming a Ru film according to the method explained in this example, a Ru film containing less impurities and offering low resistivity can be formed. From the trend of thickness of formed film, the Ru deposition rate per cycle when $H_2/N_2$ plasma was used was twice the rate achieved when $H_2$ plasma was used, suggesting that the decomposition of the Ru organic metal material coordinated by β-diketone was significantly promoted by the use of plasma generated by a $H_2/N_2$ mixture gas. These conclusions are in good agreement with the composition analysis results.

This Ru layer was typically formed by 1 to 2 nm, and approx. 5 to 20 nM of Cu layer to serve as a seed layer for Cu deposition was formed on top of this Ru layer via electroplating. It was confirmed that this Cu layer could be formed continuously without causing the Cu layer to agglomerate over the Ru layer at the bottom, regardless of whether the PVD method, CVD method or ALD method was used. In other words, the Ru layer demonstrated good adhesion to Cu and was suitable for the formation of a continuous Cu layer. It was also confirmed that, by forming a Cu film via electroplating on top of this Cu layer, sufficient burying property could be achieved using this Cu film via electroplating even with wiring structures having wiring widths of 20 to 50 nm and aspect ratios of approx. 5 to 10. Accordingly, it can be concluded that the Ru film achieved by the method explained in this example is very effective in the formation of Cu seed layers as mentioned above as well as in the formation of fine Cu wirings via electroplating. On the other hand, it was difficult to form a thin Cu layer continuously when the Ru layer was formed by $H_2$ plasma, and this application also presented other problem such as generation of voids due to the fact that it is difficult to achieve complete burying even by Cu electroplating and. These are due to a large amount of impurities.

The present invention includes the above mentioned embodiments and other various embodiments including the following:

1) A method for forming metal film by plasma atomic layer deposition, wherein said method includes steps to cause an organic metal complex containing β-diketone ligands to be chemically adsorbed onto a substrate, after which the substrate is processed using a gas containing at least hydrogen atoms and nitrogen atoms that have been activated, to form a metal layer from metal atoms constituting the aforementioned organic metal complex.

2) A method for forming metal film by plasma atomic layer deposition according to 1) above, wherein said method is characterized in that the mixture gas containing at least hydrogen atoms and nitrogen atoms is a mixture gas of hydrogen gas and nitrogen gas.

3) A method for forming metal film by plasma atomic layer deposition according to 1) or 2) above, wherein said method is characterized in that the constituent metal element of the aforementioned organic metal complex containing β-diketone ligands belongs to the 8B, 1B or 2B family.

4) A method for forming metal film by plasma atomic layer deposition according to 3) above, wherein said method is characterized in that the constituent metal element of the aforementioned organic metal complex containing β-diketone ligands is Ru, Co, Pd, Pt or Ir.

5) A method for forming metal film by plasma atomic layer deposition according to 4) above, wherein said method is characterized in that a copper film is formed on top of the aforementioned metal film.

6) A method for forming metal film by plasma atomic layer deposition according to 3) above, wherein said method is characterized in that the metal element constituting the organic metal complex containing β-diketone ligands is copper (Cu).

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a single-metal film on a substrate by plasma atomic layer deposition (ALD), comprising:
   (i) contacting a surface of a substrate with a β-diketone metal complex in a gas phase whereby molecules of the β-diketone metal complex are attached to the surface of the substrate;
   (ii) exposing the molecule-attached surface only to a nitrogen-hydrogen mixed plasma, thereby forming an atomic layer of the metal; and
   (iii) repeating steps (i) and (ii) for a next atomic layer on top of the atomic layer in step (ii), thereby accumulating the atomic layers to form the single-metal film which is a virtually pure metal layer having a purity of at least 99% on the substrate,
   wherein the nitrogen-hydrogen mixed plasma is produced by supplying a gas containing nitrogen and hydrogen, followed by applying RF power of 200 to 500 W having a frequency of 13.56 MHz to the gas,
   wherein the gas containing nitrogen and hydrogen is a mixture of nitrogen gas and hydrogen gas wherein a volumetric ratio of nitrogen gas to hydrogen gas is 5/100 to 50/100.

2. The method according to claim 1, wherein the metal constituting the β-diketone metal complex is selected from the group consisting of metals belonging to Group 8B, 1B, and 2B in the periodic chart.

3. The method according to claim 2, wherein the metal is selected from the group consisting of Ru, Co, Pd, Pt, and Ir.

4. The method according to claim 2, wherein the metal is Cu.

5. The method according to claim 1, wherein the β-diketone metal complex is constituted by three β-diketones coordinated to a metal in its molecule.

6. The method according to claim 1, wherein the β-diketone metal complex has only β-diketones coordinated to a metal in its molecule.

7. The method according to claim 1, further comprising forming a Cu film on the single-metal film.

8. The method according to claim 7, wherein the Cu film is formed by steps (i) to (iii) as a Cu seed layer.

9. The method according to claim 1, wherein steps (i) and (ii) are repeated at least 10 times.

10. The method according to claim 1, wherein steps (i) and (ii) are repeated until a thickness of the single-metal film reaches at least 0.4 to 0.5 nm.

11. The method according to claim 1, wherein the surface of the substrate on which the single-metal film is formed is constituted by a Cu barrier layer.

12. The method according to claim 1, wherein steps (i) and (ii) are conducted at a temperature of 300° C. or lower.

13. The method according to claim 1, further comprising purging the β-diketone metal complex gas after step (i) and purging the gas containing nitrogen and hydrogen after step (ii).

14. The method according to claim 1, wherein the β-diketone metal complex is the only metal compound contacting the surface of the substrate in step (i).

15. The method according to claim 1, wherein the surface of the substrate on which the single-metal film is formed has trenches and the single-metal film covers the trenches as a comformal coating.

16. The method according to claim 1, wherein the metal in the β-diketone metal complex is ruthenium.

* * * * *